(12) United States Patent
Lee et al.

(10) Patent No.: US 11,735,631 B2
(45) Date of Patent: Aug. 22, 2023

(54) SEMICONDUCTOR DEVICE

(71) Applicant: Samsung Electronics Co., Ltd., Suwon-si (KR)

(72) Inventors: Cho-eun Lee, Pocheon-si (KR); Seok-hoon Kim, Suwon-si (KR); Sang-gil Lee, Ansan-si (KR); Edward Namkyu Cho, Seongnam-si (KR); Min-hee Choi, Suwon-si (KR); Seung-hun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 24 days.

(21) Appl. No.: 17/470,288

(22) Filed: Sep. 9, 2021

(65) Prior Publication Data

US 2021/0408237 A1 Dec. 30, 2021

Related U.S. Application Data

(63) Continuation of application No. 16/453,347, filed on Jun. 26, 2019, now Pat. No. 11,145,720.

(30) Foreign Application Priority Data

Jul. 13, 2018 (KR) .................. 10-2018-0081588

(51) Int. Cl.
*H01L 29/08* (2006.01)
*H01L 29/78* (2006.01)
(Continued)

(52) U.S. Cl.
CPC .. *H01L 29/0847* (2013.01); *H01L 21/823418* (2013.01); *H01L 21/823425* (2013.01); *H01L 21/823814* (2013.01); *H01L 29/785* (2013.01)

(58) Field of Classification Search
CPC ......... H01L 29/0847; H01L 21/823418; H01L 21/823425; H01L 21/823814; H01L 29/785; H01L 29/0673; H01L 29/66439; H01L 29/775; H01L 29/66469; H01L 29/66545; H01L 29/161; H01L 29/0638; H01L 29/165; H01L 29/267; H01L 29/41791; H01L 29/7848; H01L 29/42356; B82Y 10/00
See application file for complete search history.

(56) References Cited

U.S. PATENT DOCUMENTS 8,922,003 B2 12/2014 Tan et al.
9,202,919 B1 12/2015 Liu et al.
(Continued)

FOREIGN PATENT DOCUMENTS

KR 1020130026974 A 3/2013
KR 1020160012805 A 2/2016

*Primary Examiner* — Yasser A Abdelaziez
(74) *Attorney, Agent, or Firm* — Myers Bigel, P.A.

(57) ABSTRACT

A semiconductor device includes: a fin-type active region extending on a substrate in a first direction that is parallel to an upper surface of the substrate; and a source/drain region in a recess region extending into the fin-type active region, wherein the source/drain region includes: a first source/drain material layer; a second source/drain material layer on the first source/drain material layer; and a first dopant diffusion barrier layer on an interface between the first source/drain material layer and the second source/drain material layer.

20 Claims, 22 Drawing Sheets

(51) Int. Cl.
  *H01L 21/8238* (2006.01)
  *H01L 21/8234* (2006.01)

(56) References Cited

U.S. PATENT DOCUMENTS

| | | | |
|---|---|---|---|
| 9,343,300 | B1 | 5/2016 | Jacob et al. |
| 9,397,219 | B2 | 7/2016 | Kim et al. |
| 9,520,498 | B2 | 12/2016 | Ching et al. |
| 9,935,102 | B1* | 4/2018 | Bi .................... H01L 29/66666 |
| 9,941,367 | B2 | 4/2018 | Wang et al. |
| 10,170,638 | B1* | 1/2019 | Reznicek ............ H01L 29/0649 |
| 2007/0037326 | A1 | 2/2007 | Chen et al. |
| 2007/0190731 | A1* | 8/2007 | Chen .................. H01L 29/7848 |
| | | | 257/E21.431 |
| 2009/0026552 | A1 | 1/2009 | Zhang et al. |
| 2009/0124056 | A1 | 5/2009 | Chen et al. |
| 2009/0197380 | A1* | 8/2009 | Lee .................... H01L 29/7811 |
| | | | 438/270 |
| 2013/0056795 | A1 | 3/2013 | Wu et al. |
| 2013/0087857 | A1* | 4/2013 | Ko .................. H01L 21/823807 |
| | | | 257/E21.409 |
| 2015/0255578 | A1 | 9/2015 | Chang et al. |
| 2016/0141367 | A1 | 5/2016 | Lee et al. |
| 2017/0054023 | A1 | 2/2017 | Li et al. |
| 2017/0213913 | A1* | 7/2017 | Lee .................. H01L 29/66795 |
| 2018/0040696 | A1 | 2/2018 | Li et al. |
| 2018/0069100 | A1 | 3/2018 | Bauer et al. |
| 2019/0006465 | A1 | 1/2019 | Liao et al. |

\* cited by examiner

SEMICONDUCTOR DEVICE

CROSS-REFERENCE TO RELATED APPLICATION

This application is a continuation of U.S. patent application Ser. No. 16/453,347, filed Jun. 26, 2019, which claims the benefit of and priority to Korean Patent Application No. 10-2018-0081588, filed on Jul. 13, 2018, in the Korean Intellectual Property Office, the disclosure of which is incorporated herein in its entirety by reference.

BACKGROUND

Embodiments of the inventive concept relate to a semiconductor device, and more particularly, to a semiconductor device in which a short channel effect may be mitigated and resistance of a source/drain region may also be reduced.

There is a growing demand for high integration of integrated circuit devices in accordance with miniaturization of electronic products. A short channel effect of a transistor may occur due to downscaling of integrated circuit devices, thereby degrading the reliability of the integrated circuit devices. One approach that has been proposed to reduce the short channel effect is to incorporate a fin-type active region in an integrated circuit device. However, as the design rule is reduced, the sizes of the fin-type active region, a gate line, and a source/drain region are also reduced.

SUMMARY

Embodiments of the inventive concept may provide an integrated circuit device in which the short channel effect may be mitigated and resistance of a source/drain region may also be reduced.

According to an aspect of the inventive concepts, there is provided a semiconductor device including: a fin-type active region extending on a substrate in a first direction that is parallel to an upper surface of the substrate; and a source/drain region arranged in a recess region extending into the fin-type active region, wherein the source/drain region includes: a first source/drain material layer; a second source/drain material layer on the first source/drain material layer; and a first dopant diffusion barrier layer on an interface between the first source/drain material layer and the second source/drain material layer.

According to another aspect of the inventive concepts, there is provided a semiconductor device including: a first fin-type active region and a second fin-type active region extending on a substrate in a first direction that is parallel to an upper surface of the substrate; and a source/drain region in a recess region extending into the first fin-type active region and the second fin-type active region, the source/drain region extending between the first fin-type active region and the second fin-type active region, wherein the source/drain region includes at least one dopant diffusion barrier layer extending from the first fin-type active region to the second fin-type active region.

According to another aspect of the inventive concepts, there is provided a semiconductor device including: a substrate having a channel region and a pair of recesses at two sides of the channel region; a gate insulating layer formed on the channel region; a gate structure formed on the gate insulating layer; and a source/drain region formed in the pair of recesses, wherein the source/drain region includes: a first source/drain material layer; a second source/drain material layer on the first source/drain material layer; and a first dopant diffusion barrier layer on an interface between the first source/drain material layer and the second source/drain material layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
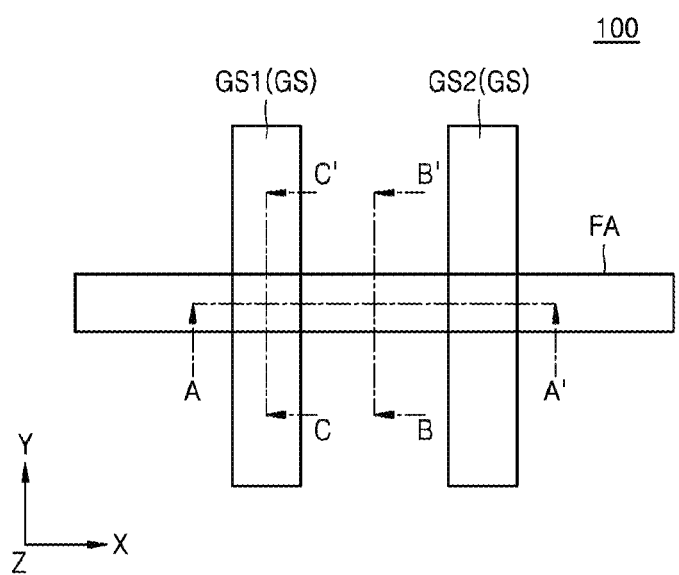
FIG. 1 is a layout diagram illustrating an integrated circuit device according to example embodiments of the inventive concept.

The inventive concept will now be described more fully with reference to the accompanying drawings, in which example embodiments of the inventive concept are shown. Like reference numerals may refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

As the size of integrated circuit devices decreases, the impact of a short channel effect may increase. It may be difficult to reduce to mitigate the short channel effect while also reducing the resistance of a source/drain region. Some embodiments of the inventive concept stem from a realization that a source/drain region may be formed to have a multi-layer structure, with a generally high-concentration layer of materials or elements, such as, but not limited to, B, P, Ge, Ga, In, As, Sb, and/or C, which may prevent or reduce dopant diffusion, at an interface between layers. Such a dopant diffusion barrier layer may reduce the resistance of the source/drain region while also mitigating the short channel effect.

Figure 2:
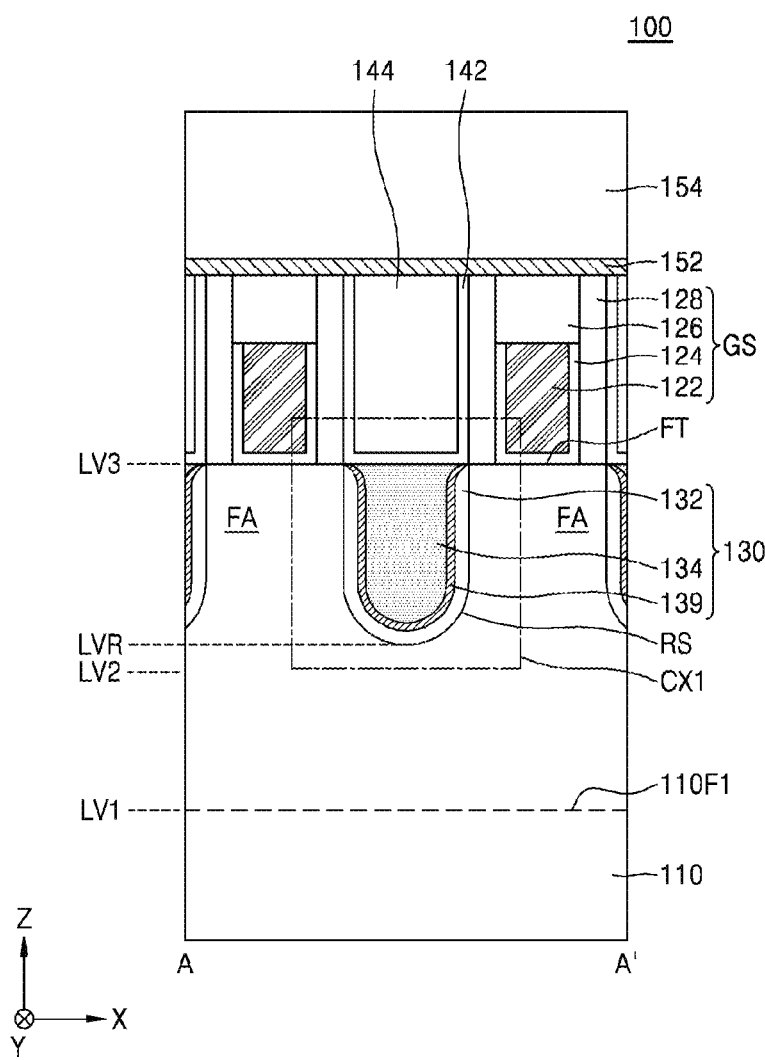
FIG. 2 is a cross-sectional view of the integrated circuit device taken along line A-A' of FIG. 1.
Figure 3:
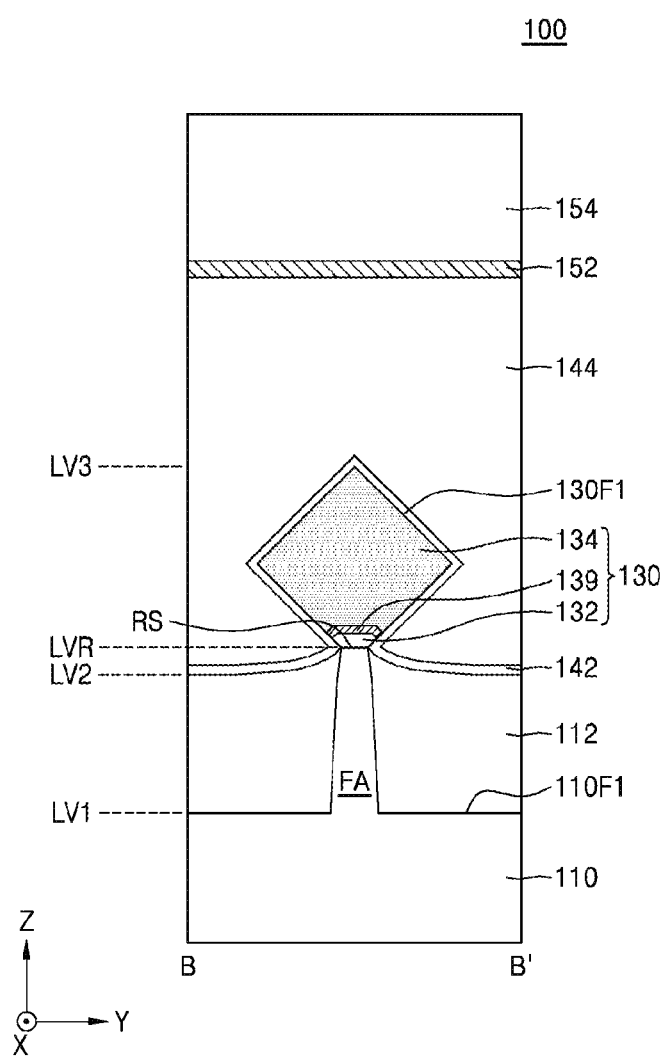
FIG. 3 is a cross-sectional view of the integrated circuit device taken along line B-B' of FIG. 1.
Figure 4:
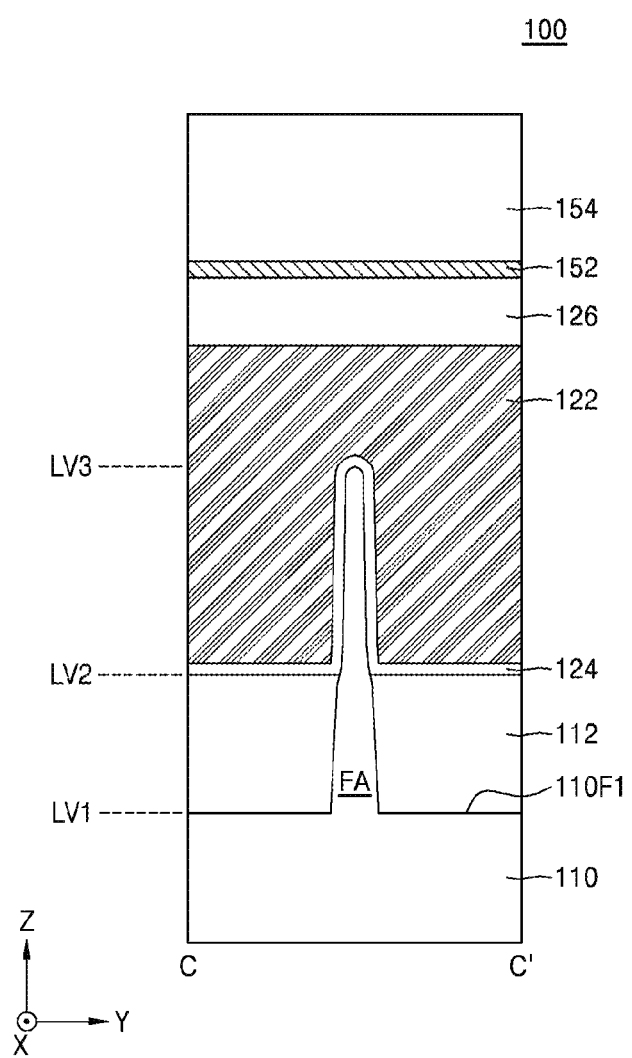
FIG. 4 is a cross-sectional view of the integrated circuit device taken along line C-C' of FIG. 1.

FIG. 1 is a layout diagram illustrating an integrated circuit device 100 according to embodiments of the inventive concept. FIG. 2 is a cross-sectional view of the integrated circuit device 100 taken along line A-A' of FIG. 1. FIG. 3 is a cross-sectional view of the integrated circuit device 100 taken along line B-B' of FIG. 1. FIG. 4 is a cross-sectional view of the integrated circuit device 100 taken along line C-C' of FIG. 1.

Referring to FIGS. 1 through 4, a fin-type active region FA may protrude from an upper surface 100F1 of a substrate 110. The fin-type active region FA may extend in a first direction (X-direction in FIG. 1) that is parallel to the upper surface 110F1 of the substrate 110. A device isolation layer 112 at least partially covers a lower portion of two opposing sidewalls of the fin-type active region FA in a cross-sectional view of the integrated circuit device 100.

According to example embodiments, the substrate 110 may include a Group IV semiconductor material, such as Si or Ge, a Group IV-IV compound semiconductor material, such as SiGe or SiC, or a Group III-V compound semiconductor material, such as GaAs, InAs, or InP. The substrate 110 may include a conductive region, for example, an impurity-doped well or an impurity-doped structure. The fin-type active region FA may be an active region constituting an NMOS transistor or an active region constituting a PMOS transistor in accordance with various embodiments of the inventive concept.

A gate structure GS extending in a second direction (Y-direction of FIG. 1) that is parallel to the upper surface 110F1 of the substrate 110 may be arranged on the fin-type active region FA and the device isolation layer 112. For example, as illustrated in FIG. 1, a first gate structure GS1 and a second gate structure GS2 may be spaced apart from each other and extend in the second direction, and may cross or intersect the fin-type active region FA extending in the first direction.

The gate structure GS may include a gate electrode 122, a gate insulating layer 124, a gate capping layer 126, and a gate spacer 128.

The gate electrode 122 may include doped polysilicon, a metal, a conductive metal nitride, a conductive metal carbide, a conductive metal silicide, or a combination thereof. For example, the gate electrode 122 may be formed of Al, Cu, Ti, Ta, W, Mo, TaN, NiSi, CoSi, TiN, WN, TiAl, TiAlN, TaCN, TaC, TaSiN, or a combination thereof, but embodiments of the inventive concept are not limited thereto. According to example embodiments, the gate electrode 122 may include a work function metal-containing layer and a gap-fill metal layer. The work function metal-containing layer may include at least one metal selected from Ti, W, Ru, Nb, Mo, Hf, Ni, Co, Pt, Yb, Tb, Dy, Er, and Pd. The gap-fill metal layer may include a W layer or an Al layer. According to example embodiments, the gate electrode 122 may include a stacked structure of TiAlC/TiN/W, a stacked structure of TiN/TaN/TiAlC/TiN/W, or a stacked structure of TiN/TaN/TiN/TiAlC/TiN/W, but embodiments of the inventive concept are not limited thereto.

The gate insulating layer 124 may be arranged to extend in the second direction and a third direction (Z-direction of FIG. 1) on a bottom surface and sidewalls of the gate electrode 122. The gate insulating layer 124 may be between the gate electrode 122 and the fin-type active region FA and between the gate electrode 122 and an upper surface of the device isolation layer 112. The gate insulating layer 124 may include a silicon oxide film, a silicon oxynitride film, a high-k film having a higher dielectric constant than that of the silicon oxide film, or a combination thereof. The high-k dielectric layer may include a metal oxide or a metal oxynitride. For example, examples of high-k dielectric layers that may be used as the gate insulating layer 124 include, without limitation, $HfO_2$, HfSiO, HfSiON, HfTaO, HfTiO, HfZrO, $ZrO_2$, $Al_2O_3$, or a combination thereof.

The gate capping layer 126 may be arranged on the gate electrode 122. The gate capping layer 126 at least partially covers an upper surface of the gate electrode 122 and may extend in the second direction (Y-direction in FIG. 1). According to example embodiments, the gate capping layer 126 may include a silicon nitride or a silicon oxynitride.

The gate spacer 128 may comprise multiple spacers and be arranged on both opposing sidewalls of the gate electrode 122 and on both sidewalls of the gate capping layer 126. The gate spacer 128 may extend on both sidewalls of the gate electrode 122 in a direction in which the gate electrode 122 extends, and the gate insulation layer 124 may be between the gate electrode 122 and the gate spacer 128 for each sidewall of the gate electrode 122. In example embodiments, the gate spacer 128 may include a silicon oxide ($SiO_x$), a silicon nitride ($SiN_x$), a silicon oxynitride ($SiO_xN_y$), a silicon carbide nitride ($SiC_xN_y$), a silicon oxide carbonitride ($SiO_xC_yN_z$), or a combination thereof.

In example embodiments, the gate spacer 128 may include a plurality of layers including different materials for each spacer on a sidewall of the gate electrode 122. FIG. 2 shows an example in which the gate spacer 128 includes a single layer. Alternatively, the gate spacer 128 may include a first spacer layer (not shown), a second spacer layer (not shown), and a third spacer layer (not shown) that are sequentially stacked on sidewalls of the gate electrode 122. In example embodiments, the first spacer layer and the third spacer layer may include a silicon nitride, a silicon oxide, a silicon oxynitride, or combinations thereof. The second spacer layer may include an insulating material having a lower dielectric constant than that of the first spacer layer. In some embodiments, the second spacer layer may include an airspace.

A source/drain region 130 may be arranged on the fin-type active region FA on both sides of the gate structure GS. The source/drain region 130 may at least partially fill the inside of a recess region RS extending into the fin-type active region FA on both sides of the gate structure GS. A bottom level LVR of the recess region RS may be higher than a level LV1 of the upper surface 110F1 of the substrate 110 so as to be between the fin-type active region FA and the upper surface 110F1 of the substrate 110, and the bottom level LVR of the recess region RS may be higher than a bottom surface level LV2 of a portion of the gate structure GS contacting the device isolation layer 112 relative to the upper surface 110F1 of the substrate 110. As shown in FIG. 3, the source/drain region 130 may have a polygonal cross-section having an inclined sidewall 130F1 in the second direction (Y-direction).

In example embodiments, the source/drain region 130 may include a first source/drain (SD) material layer 132 and a second source/drain material layer 134 arranged on the first source/drain material layer 132. In addition, a first dopant diffusion barrier layer 139 may be provided between the first source/drain material layer 132 and the second source/drain material layer 134.

While FIG. 2 illustrates that the first source/drain material layer 132 and the first dopant diffusion barrier layer 139 have a generally constant thickness overall both individually and together, the thicknesses of the first source/drain material layer 132 and/or the first dopant diffusion barrier layer 139, respectively, may vary in different regions thereof in accordance with some embodiments of the inventive concept. In some embodiments, the first dopant diffusion barrier layer 139 may be discontinuously provided between the first source/drain material layer 132 and the second source/drain material layer 134. This will be described in more detail below. In addition, some dimensions of the elements illustrated in FIG. 2 may be exaggerated for clarity, and they do not necessarily show relative dimensions of the elements.

In some embodiments, the first source/drain material layer 132 may include an epitaxial semiconductor layer doped with a first impurity at a first impurity concentration. The first source/drain material layer 132 may include a doped Si layer, a doped Ge layer, a doped SiP layer, a doped SiGe layer, or a doped InGaAs layer, but embodiments of the inventive concept are not limited thereto.

In some embodiments, when the fin-type active region FA is an active region for an NMOS transistor, the source/drain region 130 may include SiP doped with the first impurity or Si doped with the first impurity, and the first impurity may be phosphorous (P), arsenic (As), antimony (Sb), or the like. In other embodiments, when the fin-type active region FA is an active region for a PMOS transistor, the source/drain region 130 may include SiGe doped with the first impurity, and the first impurity may be boron (B), gallium (Ga), or the like. In example embodiments, the first impurity concentration may be in a range from about 1E20 atoms/cm$^3$ to about 1E22 atoms/cm$^3$, but embodiments of the inventive concept are not limited thereto.

In some embodiments, the second source/drain material layer 134 may include an epitaxial semiconductor layer doped with the first impurity at a second impurity concentration higher than the first impurity concentration. The second source/drain material layer 134 may include a doped Si layer, a doped Ge layer, a doped SiP layer, a doped SiGe layer, or a doped InGaAs layer, but is not limited thereto. In some embodiments, the second impurity concentration may be in a range from about 110% to about 150% of the first impurity concentration, but embodiments of the inventive concept are not limited thereto.

In some embodiments, the source/drain region 130 may be a doped SiP, and a concentration of phosphorus (P) in the second source/drain material layer 134 may be higher than that of P in the first source/drain material layer 132. In some embodiments, a P concentration in the second source/drain material layer 134 may be substantially equal to a P concentration in the first source/drain material layer 132.

In some embodiments, the source/drain region 130 may be a doped SiGe layer, and a concentration of germanium (Ge) in the second source/drain material layer 134 may be higher than that of Ge in the first source/drain material layer 132. In some embodiments, a Ge concentration in the second source/drain material layer 134 may be substantially equal to a Ge concentration in the first source/drain material layer 132.

The first dopant diffusion barrier layer 139 may be an epitaxial semiconductor layer including a dopant diffusion-preventing element between the first source/drain material layer 132 and the second source/drain material layer 134 at a generally high concentration. In other words, in some embodiments, the first dopant diffusion barrier layer 139 may include a doped Si layer, a doped Ge layer, a doped SiP layer, a doped SiGe layer, or a doped InGaAs layer, which are doped with the dopant diffusion-preventing element at a generally high concentration.

The dopant diffusion-preventing element may be one or more materials selected from carbon (C), boron (B), germanium (Ge), indium (In), gallium (Ga), antimony (Sb), phosphorous (P), and arsenic (As). A concentration of the dopant diffusion-preventing element of the first dopant diffusion barrier layer 139 may be about twice as high as a concentration of the same dopant doped in the first source/drain material layer 132 and the second source/drain material layer 134. For example, a concentration of the dopant diffusion-preventing element of the first dopant diffusion barrier layer 139 may be about twice to about 10,000 times a concentration of the same dopant doped in the first or second source/drain material layer 132 or 134. A concentration of the dopant diffusion-preventing element in the first dopant diffusion barrier layer 139 may be about 1E18 atoms/cm$^3$ to about 5E23 atoms/cm$^3$. When the dopant diffusion-preventing element has an extremely low concentration, the first dopant diffusion barrier layer 139 may not properly perform its function of preventing diffusion of a dopant. When the dopant diffusion-preventing element has an excessively high concentration, the likelihood of defects may increase and economic feasibility may be lowered.

Referring to FIGS. 1 through 4, a first etch stop layer 142 may be arranged on sidewalls of the gate structure GS and on the source/drain region 130 and the device isolation layer 112. The first etch stop layer 142 may be conformally arranged on one or more sidewalls of the source/drain region 130. The first etch stop layer 142 may include a silicon nitride. The intergate insulating layer 144 may be arranged between the gate structure GS and another gate structure GS adjacent thereto and may at least partially cover the source/drain region 130 and the device isolation layer 112. The intergate insulating layer 144 may include a silicon nitride, a silicon oxide, a silicon oxynitride, or combinations thereof.

A second etch stop layer 152 may be arranged on the gate structure GS and the intergate insulating layer 144. The second etch stop layer 152 may include a silicon nitride. The first interlayer insulating layer 154 may be arranged on the second etch stop layer 152. The first interlayer insulating layer 154 may include a silicon oxide, a tetraethyl orthosilicate (TEOS) layer, an ultra-low K (ULK) layer having an ultra-low dielectric constant of about 2.2 to about 2.4, or combinations thereof. The ULK layer may include a SiOC layer or a SiCOH layer.

Figure 5A:
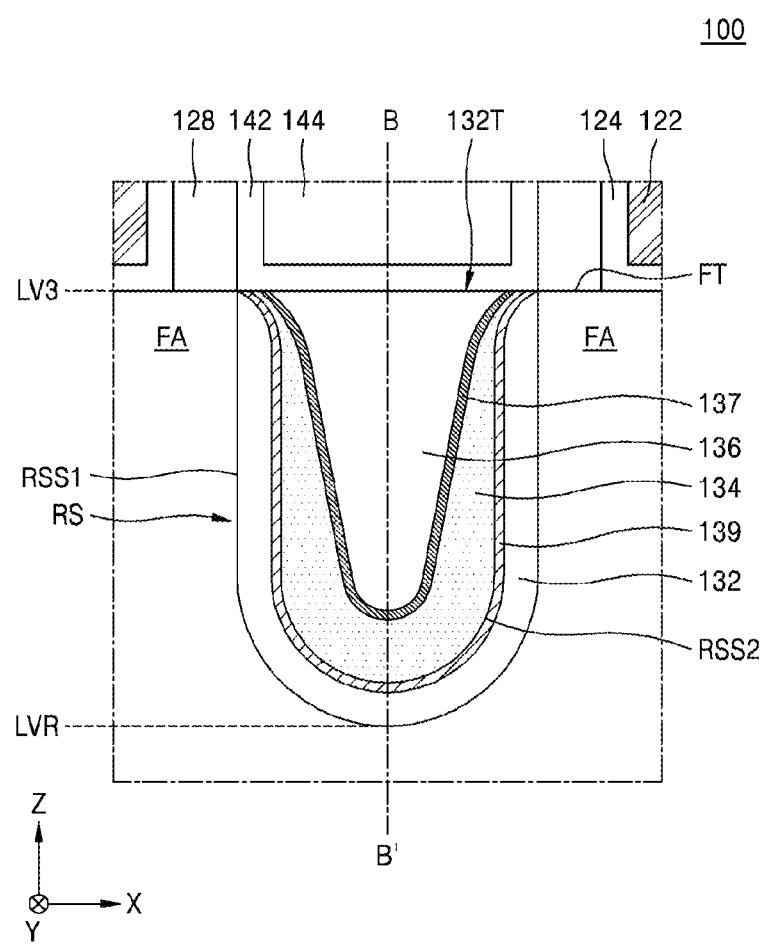
FIG. 5A is an expanded view of a portion of a semiconductor device according to embodiments of the inventive concept, corresponding to CX1 of FIG. 2.
Figure 5B:
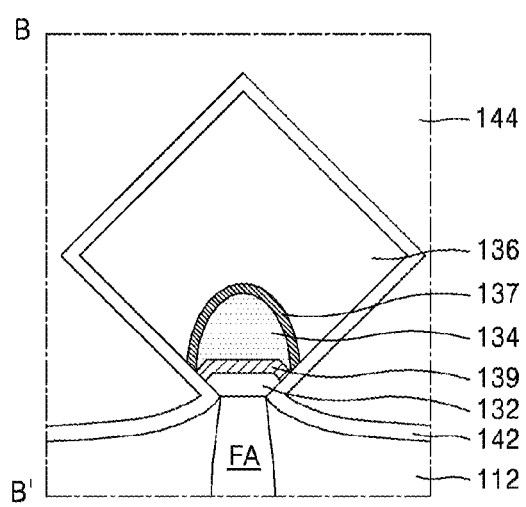
FIG. 5B is a side cross-sectional view of the semiconductor device taken along line B-B' of FIG. 5A.

FIG. 5A is an expanded view of a portion of a semiconductor device 100, according to embodiments of the inventive concept, corresponding to CX1 of FIG. 2. FIG. 5B is a side cross-sectional view of the semiconductor device 100 taken along line B-B' of FIG. 5A. In FIG. 5A, the arrangement of only some elements of the integrated circuit device 100, for example, the fin-type active region FA and the gate structure GS, is illustrated.

Referring to FIGS. 5A and 5B, a first source/drain material layer 132 and a second source/drain material layer 134 are arranged in a recess region RS. A first dopant diffusion barrier layer 139 may be provided between the first source/drain material layer 132 and the second source/drain material layer 134.

In addition, a third source/drain material layer 136 may be provided on the second source/drain material layer 134, and a second dopant diffusion barrier layer 137 may be provided between the second source/drain material layer 134 and the third source/drain material layer 136.

The third source/drain material layer 136 may include an epitaxial semiconductor layer in which the first impurity is doped at a third impurity concentration that is higher than the second impurity concentration. The third source/drain material layer 136 may include a doped Si layer, a doped Ge layer, a doped SiP layer, a doped SiGe layer, and/or a doped InGaAs layer, but embodiments of the inventive concept are not limited thereto. In some embodiments, the third impurity concentration may be in a range from about 110% to about 150% of the second impurity concentration, but embodiments of the inventive concept are not limited thereto.

The second dopant diffusion barrier layer 137 may be an epitaxial semiconductor layer including a dopant diffusion-preventing element at a high concentration between the second source/drain material layer 134 and the third source/drain material layer 136. In other words, the second dopant diffusion barrier layer 137 may include a doped Si layer, a doped Ge layer, a doped SiP layer, a doped SiGe layer, a doped InGaAs layer, or combinations thereof, which are doped with the dopant diffusion-preventing element at a generally high concentration. In some embodiments, a concentration of the dopant diffusion-preventing element of the second dopant diffusion barrier layer 137 may be higher than that of the dopant diffusion-preventing element of the first dopant diffusion barrier layer 139.

In the embodiments illustrated in FIGS. 2, 3, 5A, and 5B, the source/drain material layer including two or three material layers is illustrated, but the source/drain material layer may include three or more material layers in accordance with various embodiments of the inventive concept. In addition, in accordance with some embodiments, the dopant diffusion barrier layer may be selectively arranged between any two adjacent arbitrary source material layers and/or between any two adjacent arbitrary drain material layers from among the plurality of source/drain material layers. In other words, the dopant diffusion barrier layer may be arranged only between source/drain material layers of any pair from among the plurality of source/drain material layers, or between every two source/drain material layers.

It will be understood that a growth speed on a (001) surface and a (110) surface of a substrate, particularly, a silicon substrate, may be controlled, and according to this control, a growth rate of a material being generated in a vertical direction and a growth rate of the material in a horizontal direction may be adjusted. Accordingly, a growth speed of each of first, second, and third source/drain material layers 132, 134, and 136 and each of the first and second dopant diffusion barrier layers 139 and 137 may be adjusted, and thicknesses of the first, second, and third source/drain material layers 132, 134, and 136 may be adjusted accordingly.

Figure 6A:
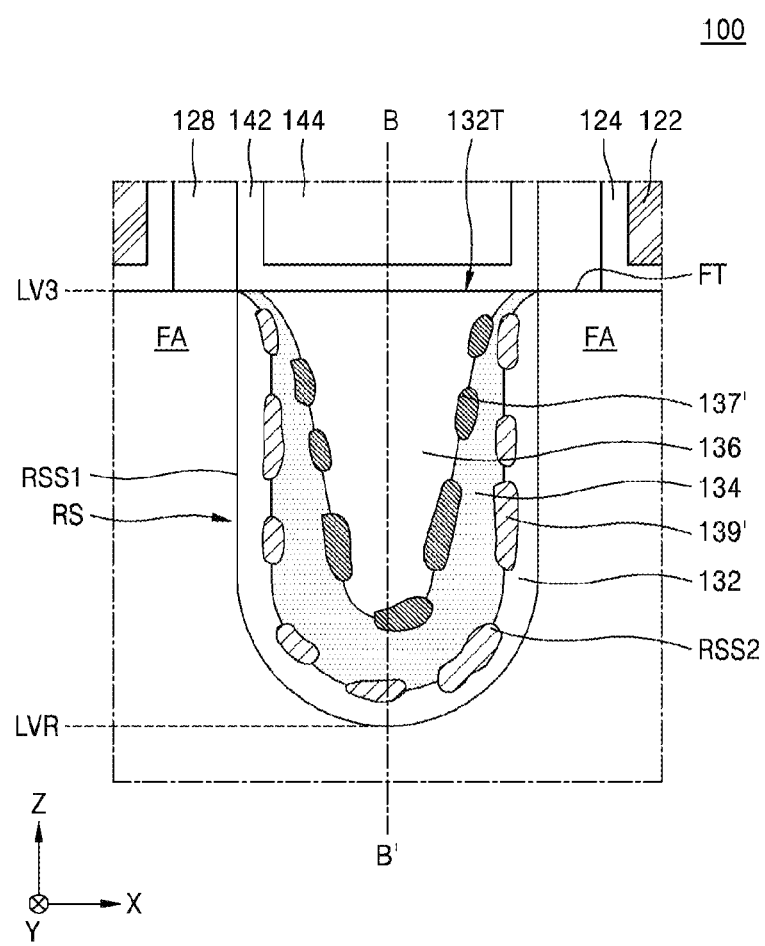
FIG. 6A is an expanded view of a portion of a semiconductor device according to further example embodiments of the inventive concept, corresponding to CX1 of FIG. 2.

FIG. 6A is an expanded view of a portion of a semiconductor device 100 according to further embodiments of the inventive concept, corresponding to CX1 of FIG. 2.

Referring to FIG. 6A, a first dopant diffusion barrier layer 139' is arranged between the first source/drain material layer 132 and the second source/drain material layer 134, and a second dopant diffusion barrier layer 137' is arranged between the second source/drain material layer 134 and the third source/drain material layer 136.

The first dopant diffusion barrier layer 139' and the second dopant diffusion barrier layer 137' of FIG. 6A may have an irregular thickness unlike the first and second dopant diffusion barrier layers 139 and 137 illustrated in FIGS. 5A and 5B. The first dopant diffusion barrier layer 139' and the second dopant diffusion barrier layer 137' may include dopant diffusion-preventing elements clustered at points, as shown by FIG. 6A.

Referring to FIG. 6A, points of the dopant diffusion-preventing elements constituting the first dopant diffusion barrier layer 139' may overlap each other, thereby contributing to an irregular thickness of the first dopant diffusion barrier layer 139'. In addition, the points of the dopant diffusion-preventing elements constituting the first dopant diffusion barrier layer 139' may not necessarily be continuous, and, accordingly, portions of the first source/drain material layer 132 and the second source/drain material layer 134 may directly contact each other.

The points of the dopant diffusion-preventing elements constituting the second dopant diffusion barrier layer 137' may also overlap each other, thereby contributing to an irregular thickness of the second dopant diffusion barrier layer 137'. In addition, the points of the dopant diffusion-preventing elements constituting the second dopant diffusion barrier layer 137' may not be necessarily continuous. That is, the points of the dopant diffusion-preventing elements may be distributed in an off-and-on or non-contiguous manner.

Figure 6B:
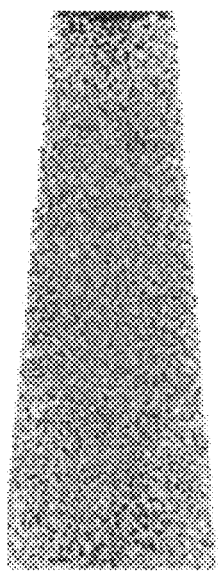
FIGS. 6B and 6C are photographic images showing a result of atom probe tomography (APT) analysis performed on a source/drain region manufactured without forming a dopant diffusion barrier layer and a source/drain region manufactured by forming a dopant diffusion barrier layer, respectively, according to some embodiments of the inventive concept.
Figure 6C:
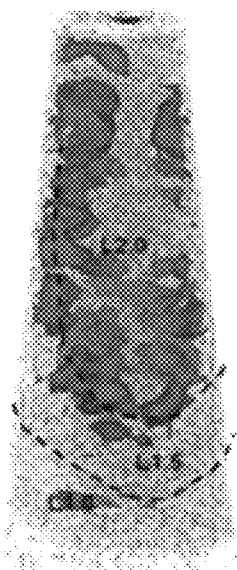

FIGS. 6B and 6C are photographic images showing a result of atom probe tomography (APT) analysis performed on a source/drain region manufactured without forming a dopant diffusion barrier layer and a source/drain region manufactured by forming a dopant diffusion barrier layer, respectively, according to some embodiments of the inventive concept.

Comparing FIGS. 6B and 6C, points of a relatively dark color are distributed between one source/drain material layer (marked as L1.5) and another source/drain material layer (marked as L2.0). The points of the relatively dark color illustrated in FIG. 6C are points of the dopant diffusion-preventing elements. By performing APT analysis, distribution of a desired element may be analyzed two-dimensionally or three-dimensionally, and the photographic image showing a distribution of dopant elements as shown in FIG. 6C may be obtained.

The above analysis may also be performed by electronic energy loss spectroscopy (EELS), energy dispersive X-ray spectroscopy (EDX), or the like.

Thus, the short channel effect may be mitigated and resistance of the source/drain region may also be reduced in semiconductor devices in accordance with embodiments of the inventive concepts described above.

FIGS. 7 through 13 are cross-sectional views illustrating a method of manufacturing an integrated circuit device 100, according to example embodiments of the inventive concept. FIGS. 7 through 13 illustrate cross-sections of the integrated circuit device 100 taken along line A-A' and line B-B' of FIG. 1 in a process order. In FIGS. 7 through 13, like reference numerals as those of FIGS. 1 through 6 denote like elements.

Figure 7:
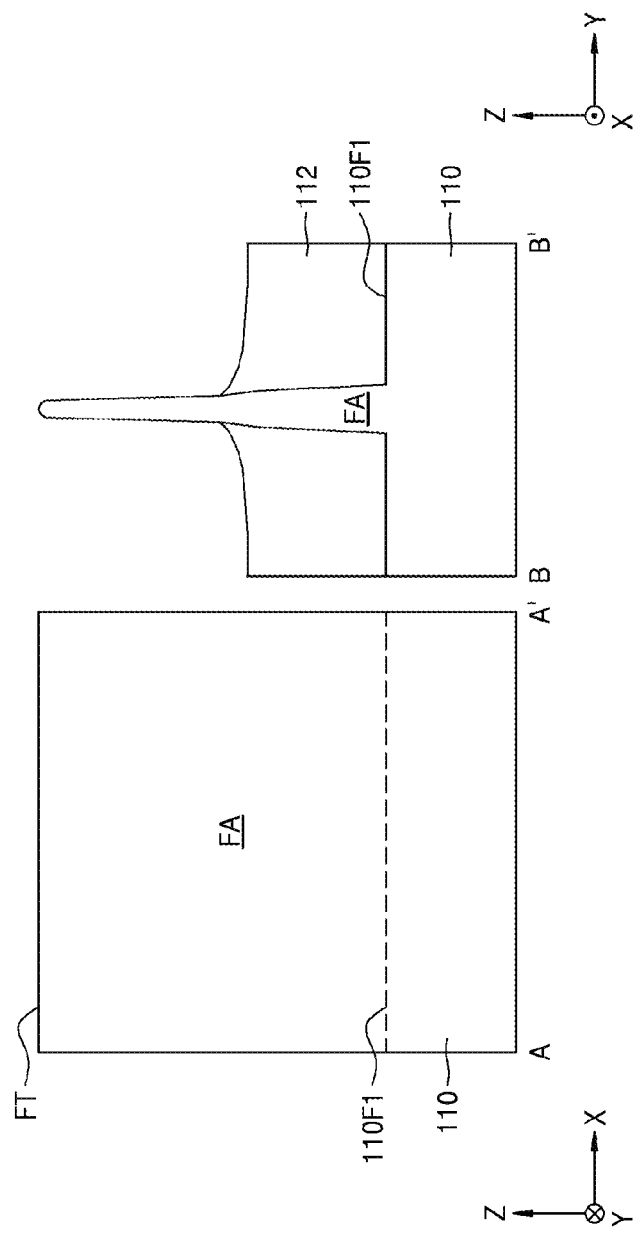
FIGS. 7 through 13 are cross-sectional views illustrating a method of manufacturing an integrated circuit device according to example embodiments of the inventive concept.

Referring to FIG. 7, a partial area of an active region of the substrate 110 may be etched vertically from the upper surface 110F1 of the substrate 110, and a fin-type active region FA extending in a first direction (X-direction) may be formed.

A device isolation layer 112 at least partially covering both sidewalls of the fin-type active region FA may be formed on the substrate 110. Although not illustrated in the drawings, an interface layer at least partially conformally covering a sidewall of the fin-type active region FA may be further formed between the device isolation layer 112 and the fin-type active region FA.

Figure 8:
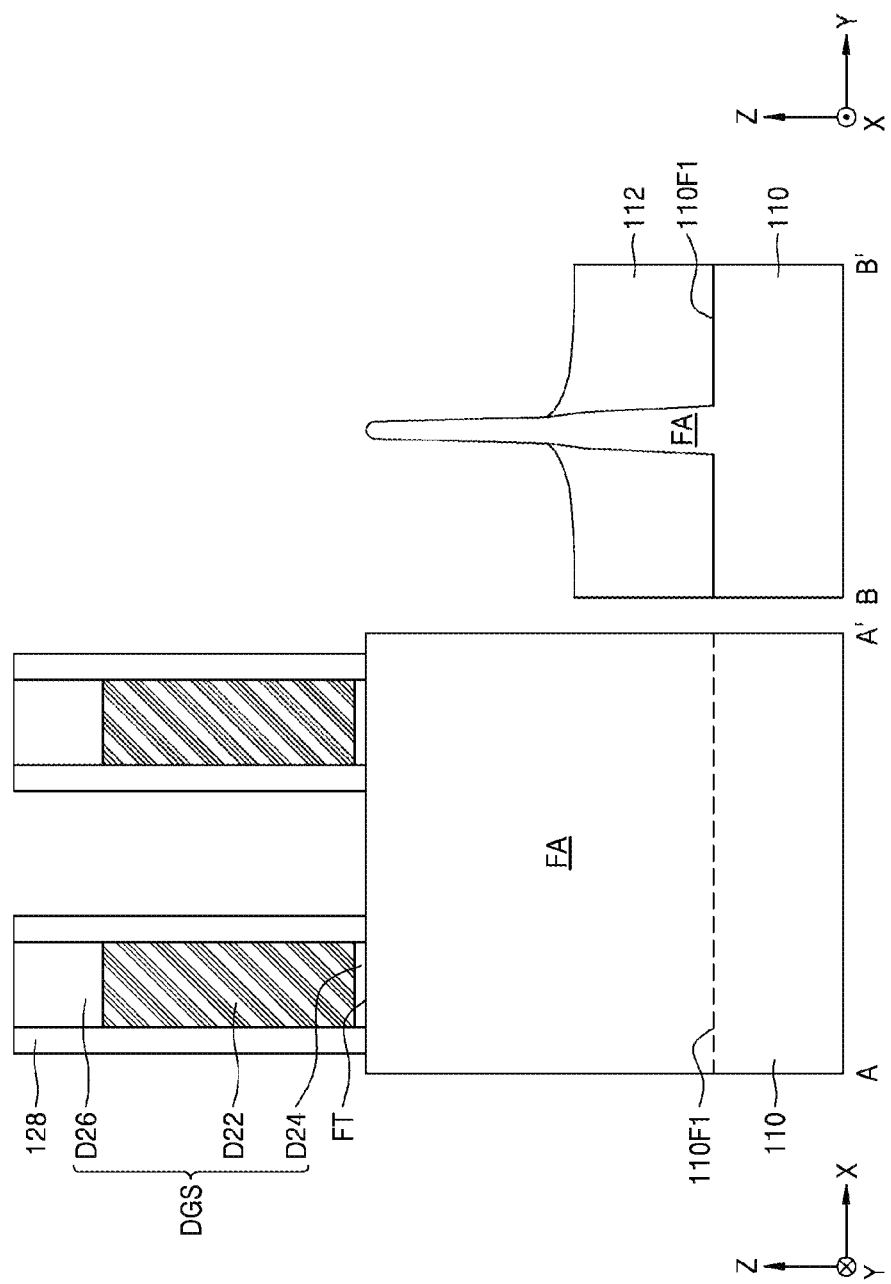

Referring to FIG. 8, a sacrificial gate structure DGS extending in a second direction (Y-direction) is formed on the substrate 110. In example embodiments, a sacrificial gate insulating pattern D24, a sacrificial gate D22, and a hard mask pattern D26 sequentially stacked on the substrate 110 are formed, and next, an insulating layer (not shown) covering the hard mask pattern D26, the sacrificial gate D22, and the sacrificial gate insulating pattern D24 may be formed using an atomic layer deposition (ALD) process or a chemical vapor deposition (CVD) process, and an anisotropic etching process may be performed on the insulating layer to form a gate spacer 128 on the hard mask pattern D26, the sacrificial gate D22, and the sacrificial gate insulating pattern D24. The gate spacer 128 may include a silicon nitride, but embodiments of the inventive concept are not limited thereto.

Figure 9:
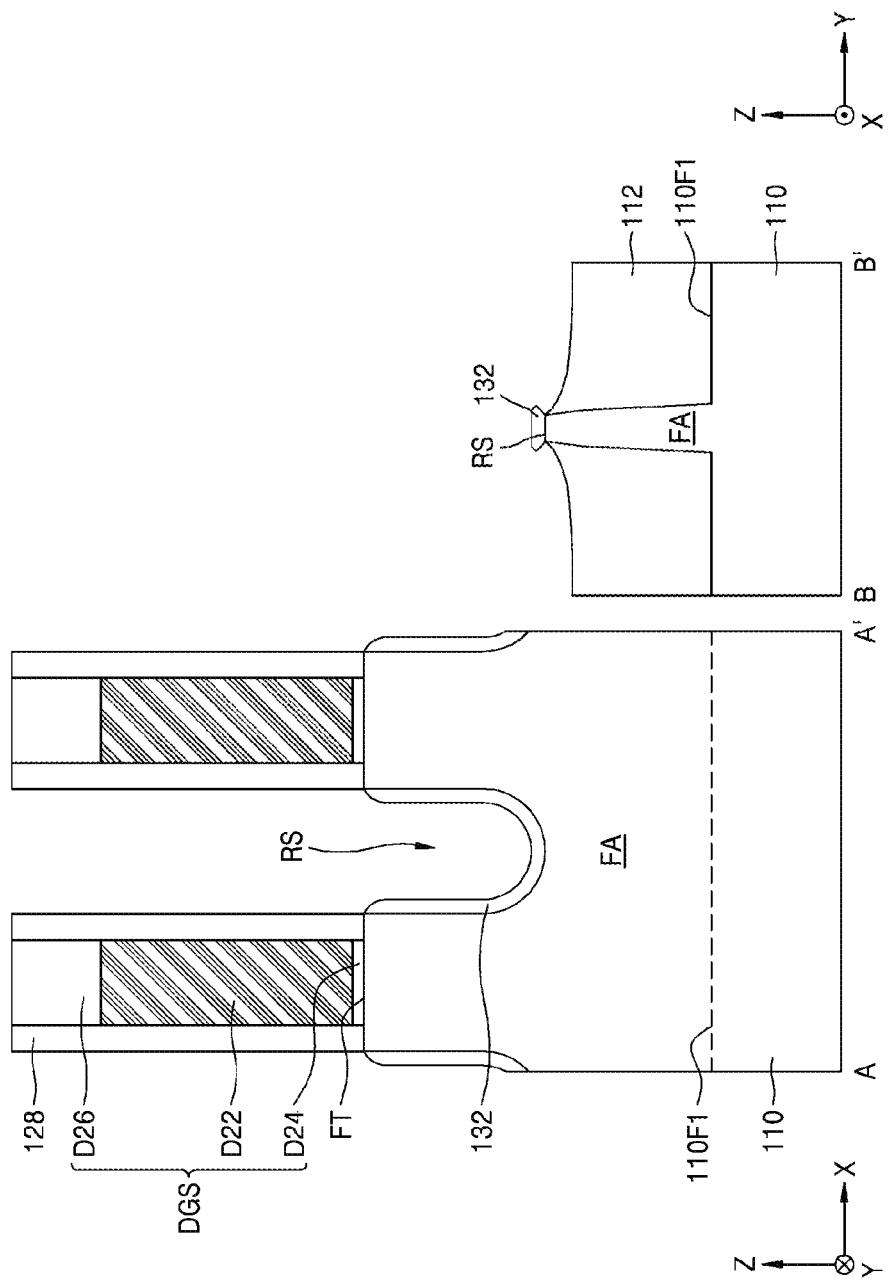

Referring to FIG. 9, a recess region RS may be formed by etching a portion of the fin-type active region FA on both sides of the sacrificial gate structure DGS and the gate spacer 128. In example embodiments, a process of forming the recess region RS may include a dry etching process, a wet etching process, or a combination thereof.

In the process of forming the recess region RS, in some embodiments, a portion of the fin-type active region FA below the gate spacer 128 may be further removed, such that the recess region RS extends in a lateral direction, and a portion of the recess region RS may vertically overlap the gate spacer 128.

Next, a first source/drain material layer 132 may be formed on an inner wall of the recess region RS. While the first source/drain material layer 132 may be generally conformally formed as illustrated in FIG. 9, the first source/drain material layer 132 may also be formed not conformally.

The first source/drain material layer 132 may be formed using an epitaxy process by using a sidewall of the fin-type active region FA exposed to the inner wall of the recess region RS and an upper surface of the substrate 110. The epitaxy process may be vapor-phase epitaxy (VPE), a chemical vapor deposition (CVD) process, such as ultra-high vacuum chemical vapor deposition (UHV-CVD), molecular beam epitaxy, or a combination thereof. In the epitaxy process, the first source/drain material layer 132 may be formed at a process pressure of about 50 Torr to about 400 Torr by using a liquid precursor or a vapor precursor as a precursor used to form the first source/drain material layer 132.

In the epitaxy process of forming the first source/drain material layer 132, a first impurity may be in-situ doped in the first source/drain material layer 132. The first source/drain material layer 132 may include the first impurity in a range from about 1E20 atoms/cm$^3$ to about 5E21 atoms/cm$^3$, but embodiments of the inventive concept are not limited thereto.

Figure 10:
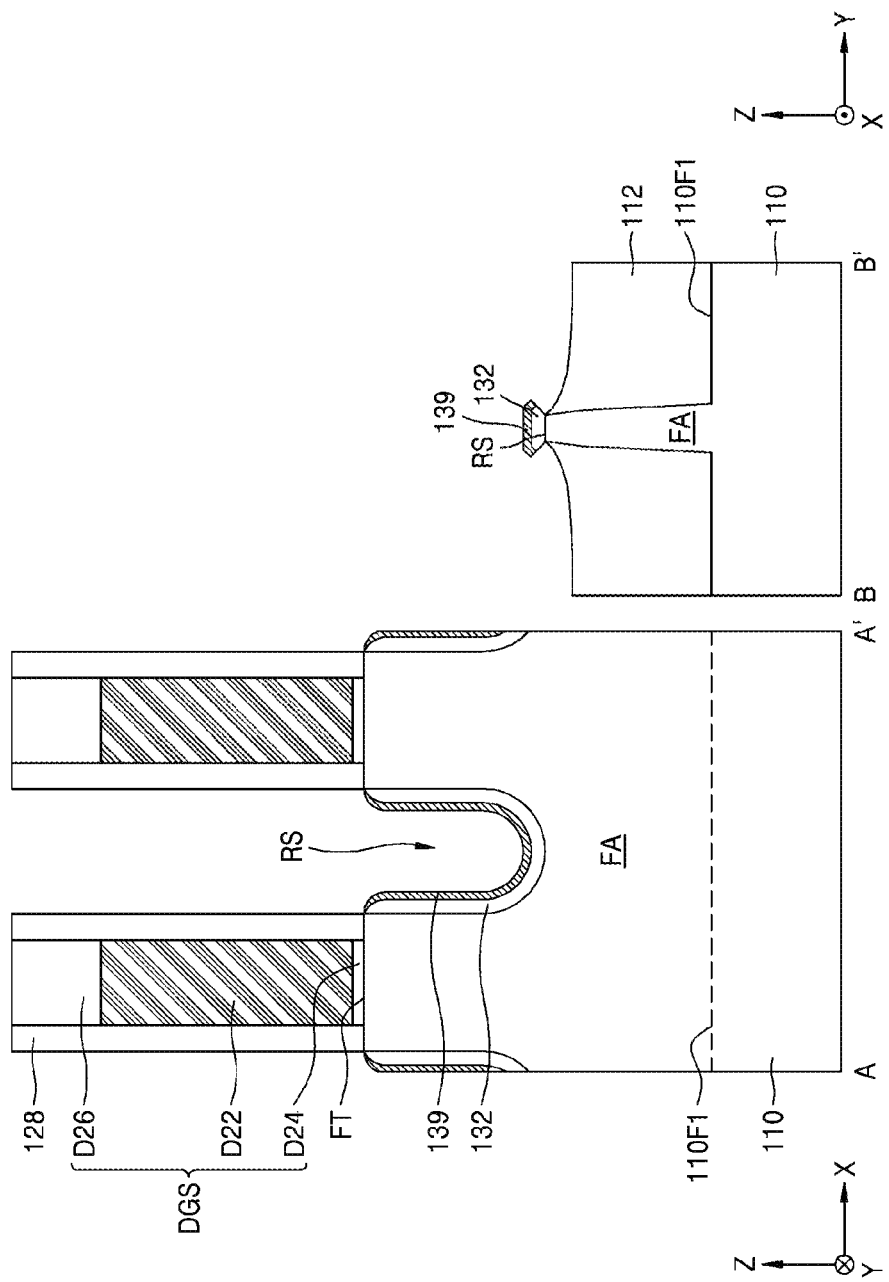

Referring to FIG. 10, a first dopant diffusion barrier layer 139 is formed on the first source/drain material layer 132. To form the first dopant diffusion barrier layer 139 having a dopant diffusion-preventing element at a relatively high concentration, a source material including the dopant diffusion-preventing element may be supplied to a reaction chamber at a relatively high concentration.

Figure 14:
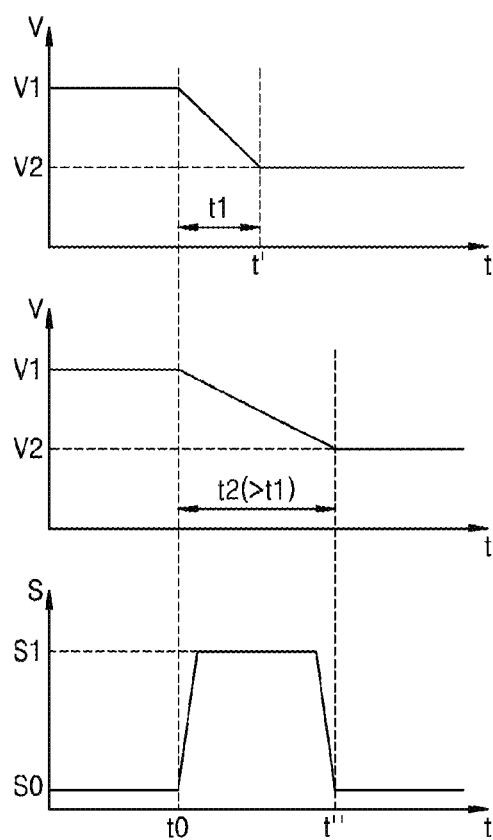
FIG. 14 shows conceptual timing diagrams that illustrate a method of forming a first dopant diffusion barrier layer according to some embodiments of the inventive concept compared to a method without forming the first dopant diffusion barrier layer.

FIG. 14 shows conceptual timing diagrams that illustrate a method of forming the first dopant diffusion barrier layer 139 according to some embodiments of the inventive concept compared to a method of not forming a first dopant diffusion barrier layer.

Referring to FIG. 14, when not forming the first dopant diffusion barrier layer 139, a first source/drain material layer 132 may be formed until time t0 under a first reaction condition represented by V1, and then the condition may be modified to a second reaction condition represented by V2 to start forming of a second source/drain material layer 134 at time t'. Changing the condition from the first reaction condition V1 to the second reaction condition V2 may take a time period t1(=t'−t0).

When forming the first dopant diffusion barrier layer 139, a first source/drain material layer 132 may be formed until a time t0 at a first reaction condition represented by V1, and then, the condition may be modified to a second reaction condition represented by V2 over a long time period t2 (=t"−t0), which is longer than t1. The time t" may be a time when forming of the second source/drain material layer 134 starts.

The supplying of a source material for forming the first dopant diffusion barrier layer 139 may be conducted during a conversion period of t2. That is, at time t0 at which conversion from the first reaction condition to the second reaction condition starts, a source material including the dopant diffusion-preventing element is increased to a concentration S1. In addition, at time t" at which conversion from the first reaction condition to the second reaction condition is completed, supply of a source material including the dopant diffusion-preventing element is reduced to a concentration S0 or stopped.

For example, when a device to be manufactured is a PMOS device and the first source/drain material layer 132 is SiGe, forming of the first source/drain material layer 132 may be completed at time t0 and supply of a source material including the dopant diffusion-preventing element may be increased to time t" at which forming of the second source/drain material layer 134 is started. Here, SiGe is also formed although relatively slowly, and, thus, the first dopant diffusion barrier layer 139 in which SiGe is doped with a dopant diffusion-preventing element at a relatively high concentration may be obtained. Also, when a device to be manufactured is an NMOS device and the first source/drain material layer 132 is SiP, the first dopant diffusion barrier layer 139 in which SiP is doped with a dopant diffusion-preventing element at a relatively high concentration may be obtained.

Figure 11:
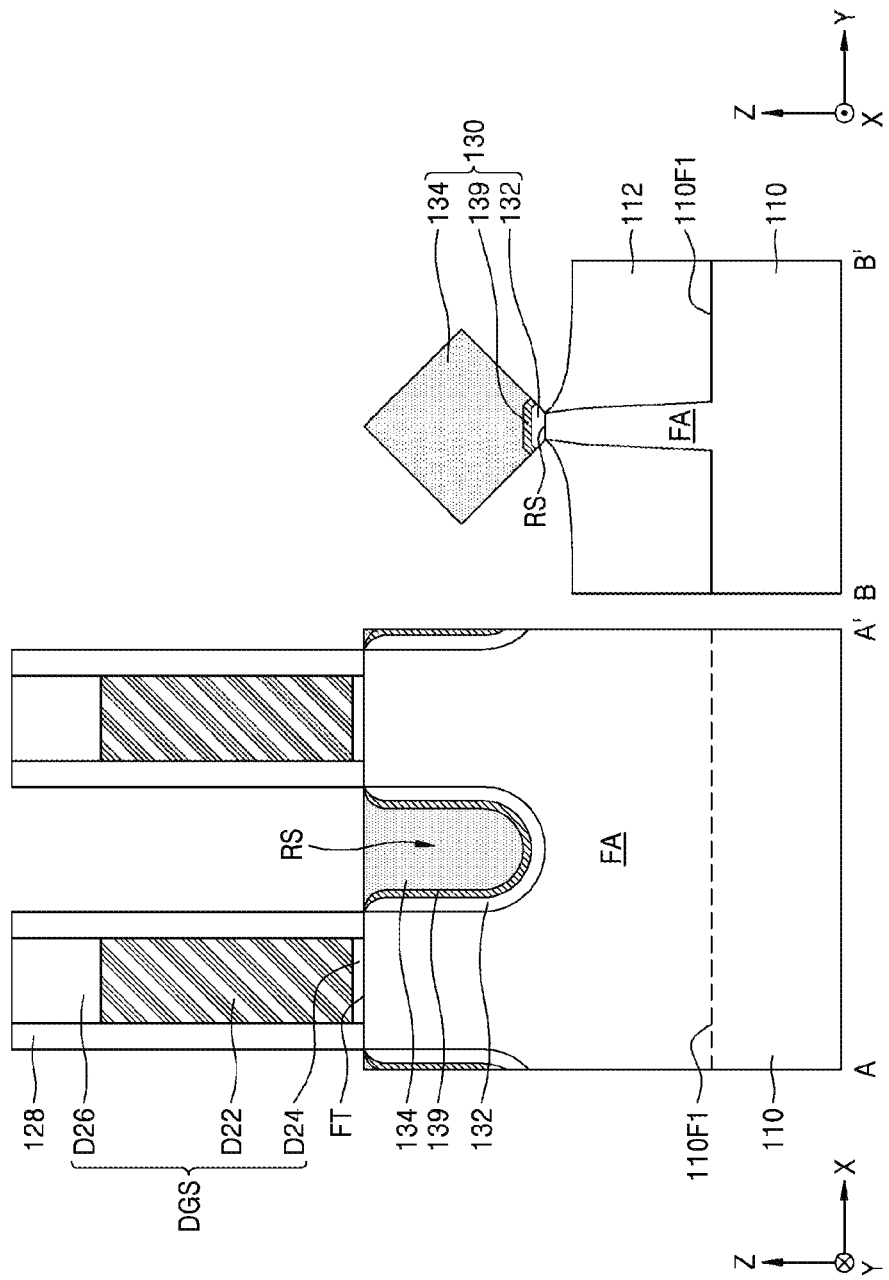

Referring to FIG. 11, a second source/drain material layer 134 may be formed on the first dopant diffusion barrier layer 139. The second source/drain material layer 134 may be formed through an epitaxy process by using the first dopant diffusion barrier layer 139 as a seed layer under the second reaction condition.

The epitaxy process may be VPE, a CVD process, such as UHV-CVD, molecular beam epitaxy, or a combination thereof. In the epitaxy process, the second source/drain material layer 134 may be formed at a process pressure of about 20 Torr to about 150 Torr by using a liquid precursor or a vapor precursor as a precursor used to form the second source/drain material layer 134.

Figure 12:
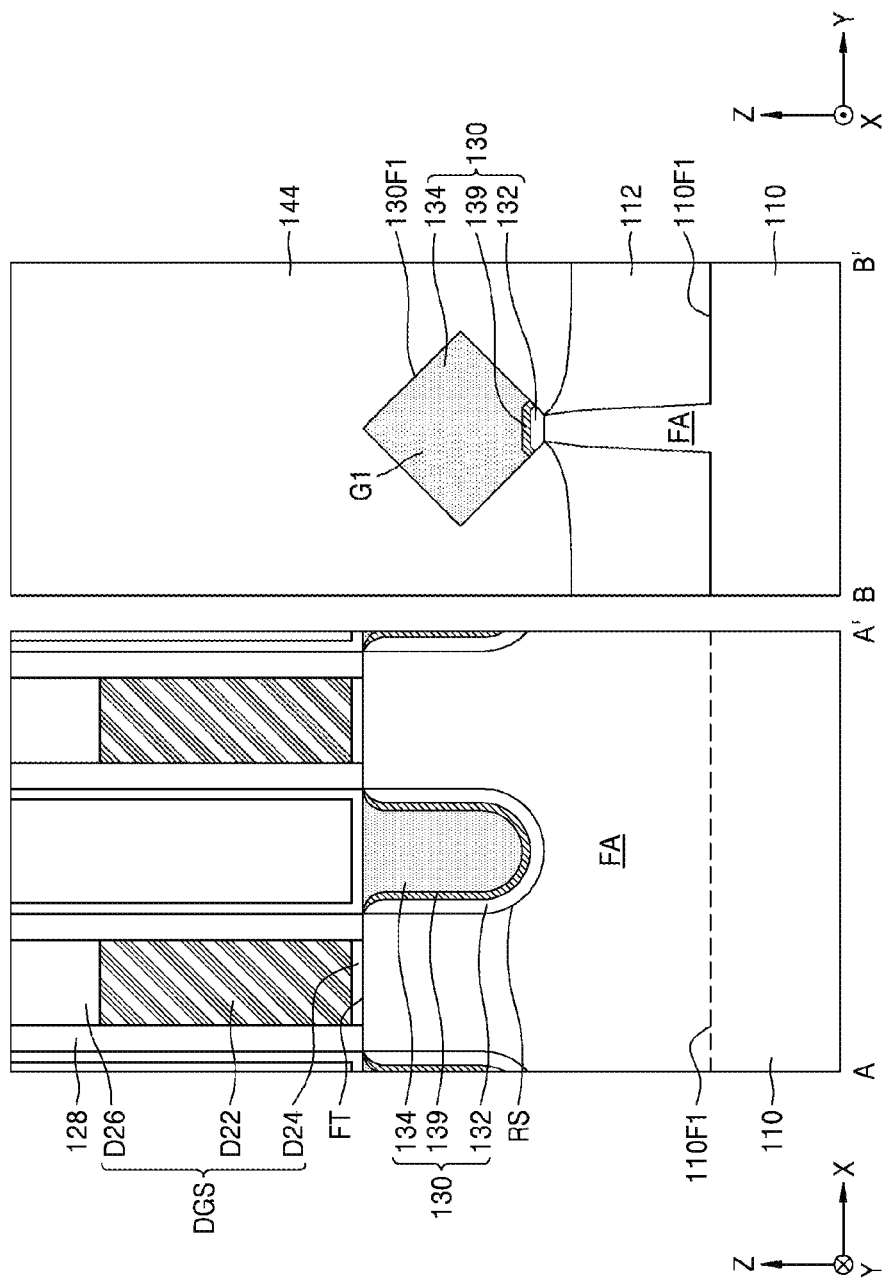

Referring to FIG. 12, a first etch stop layer 142 at least partially covering the sacrificial gate structure DGS and the source/drain region 130 may be formed on the substrate 110. An insulating layer (not shown) may be formed on the first etch stop layer 142, and the insulating layer may be planarized so that an upper surface of the hard mask pattern D26 is exposed to thereby form an intergate insulating layer 144.

Figure 13:
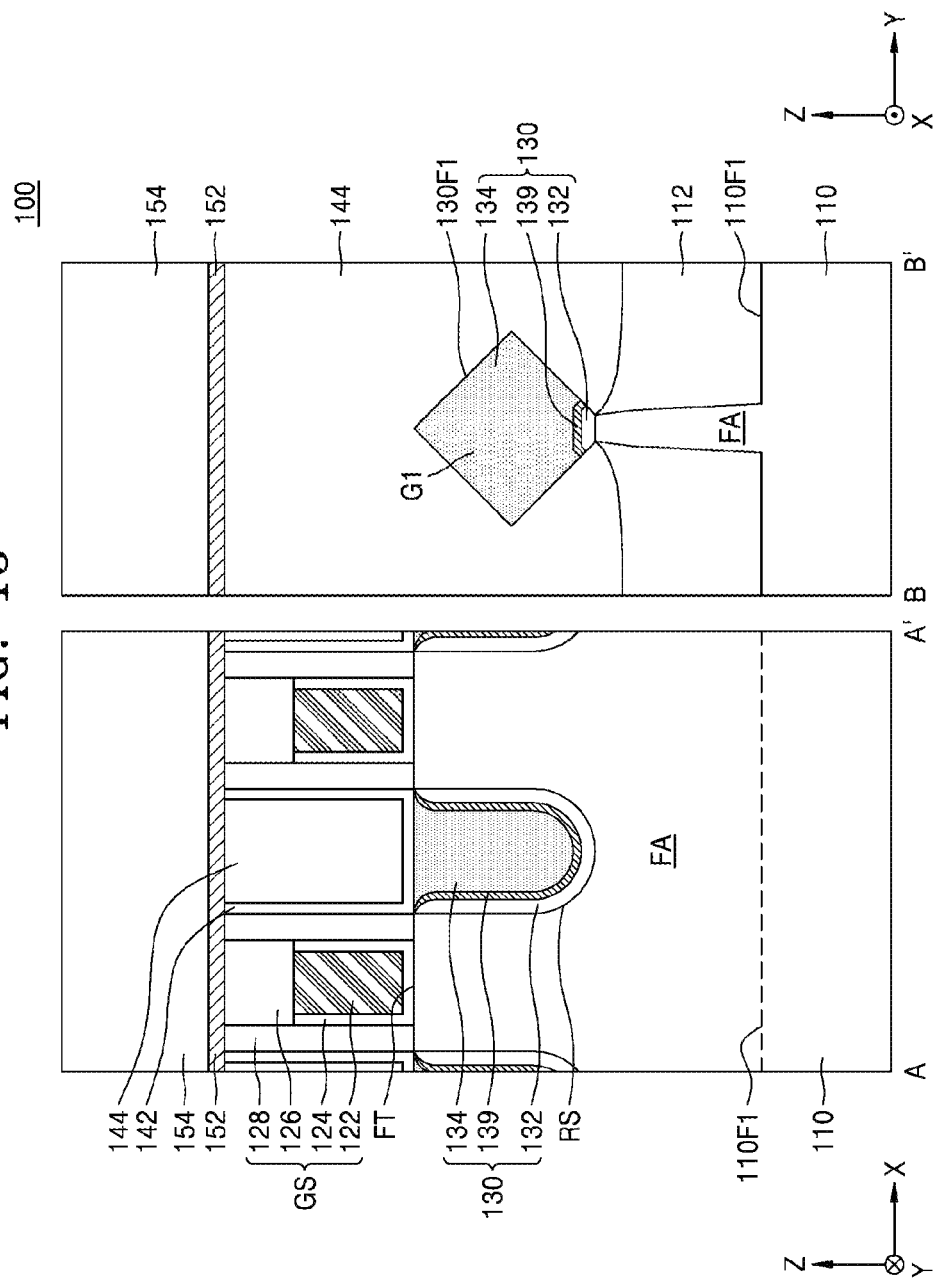

Referring to FIG. 13, the hard mask pattern D26 (see FIG. 12), the sacrificial gate D22 (see FIG. 12), and the sacrificial gate insulating pattern D24 (see FIG. 12) may be removed, and then a gate insulating layer 124 may be formed on inner walls of one pair of gate spacers 128 and the fin-type active region FA. Next, after forming a conductive layer (not shown) that fills a space between the pair of gate spacers 128 on the gate insulating layer 124, an upper portion of the conductive layer may be etched-back, thereby forming a gate electrode 122. Next, an insulating layer (not shown) that fills a remaining portion between the pair of gate spacers 128, on the gate electrode 122 and the intergate insulating layer 144, an upper portion of the insulating layer may be removed until the intergate insulating layer 144 or upper surfaces of the gate spacers 128 are exposed, thereby forming a gate capping layer 126. Accordingly, a gate structure GS including the gate electrode 122, the gate insulating layer 124, the gate capping layer 126, and the gate spacers 128 may be formed.

In example embodiments, the process of removing the hard mask pattern D26, the sacrificial gate D22, and the sacrificial gate insulating pattern D24 may include a wet etching process. The wet etching process may be performed using, for example, $HNO_3$, diluted fluoric acid (DHF), $NH_4OH$, tetramethylammonium hydroxide (TMAH), KOH, or a combination thereof.

Next, a second etch stop layer 152 and a first interlayer insulating layer 154 may be formed on the gate structure GS and the intergate insulating layer 144. Although not illustrated in the drawings, a contact hole (not shown) passing through the first interlayer insulating layer 154 and the second etch stop layer 152 to expose an upper surface of the source/drain region 130 may be formed, and by at least partially filling the contact hole with a conductive material, a contact (not shown) connected to the source/drain region 130 may be formed.

The integrated circuit device 100 may be completed by using the above-described manufacturing method. According to the above-described manufacturing method, a dopant diffusion barrier layer preventing or reducing diffusion of a dopant from among a plurality of source/drain material layers may be provided to thereby mitigate the short channel effect and also reduce resistance of the source/drain region.

Figure 15:
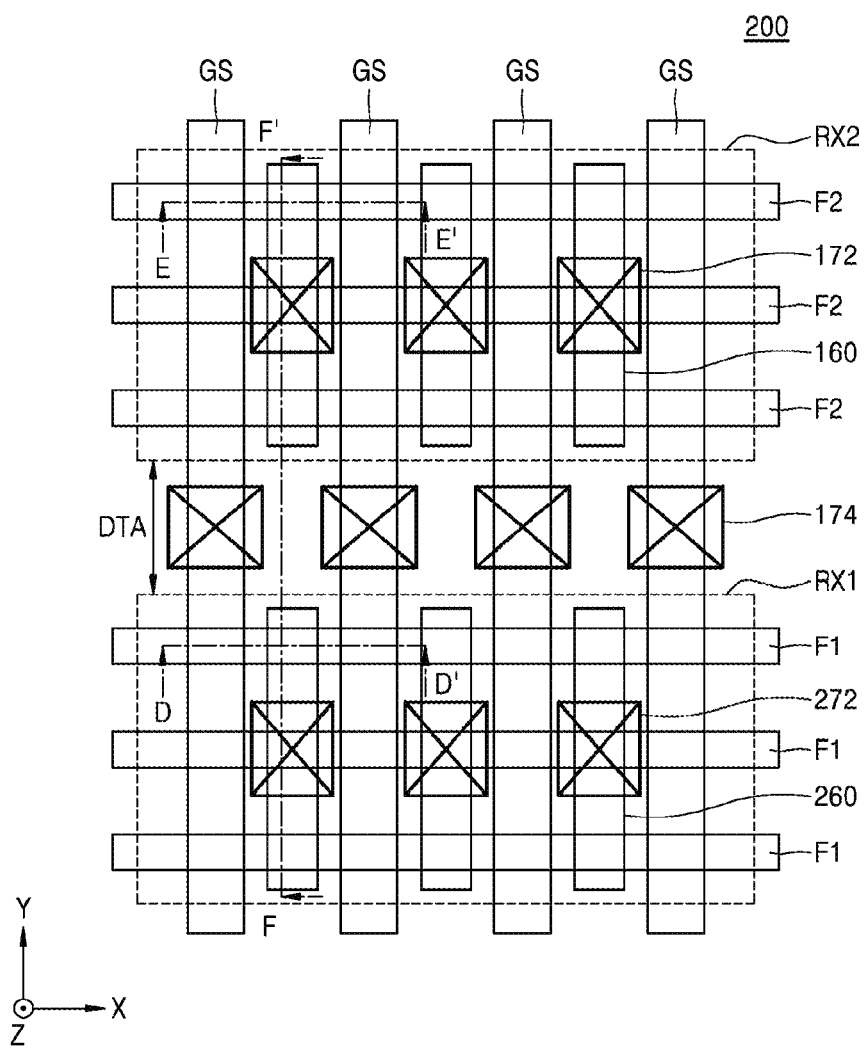
FIG. 15 is a layout diagram illustrating an integrated circuit device according to example embodiments of the inventive concept.
Figure 16:
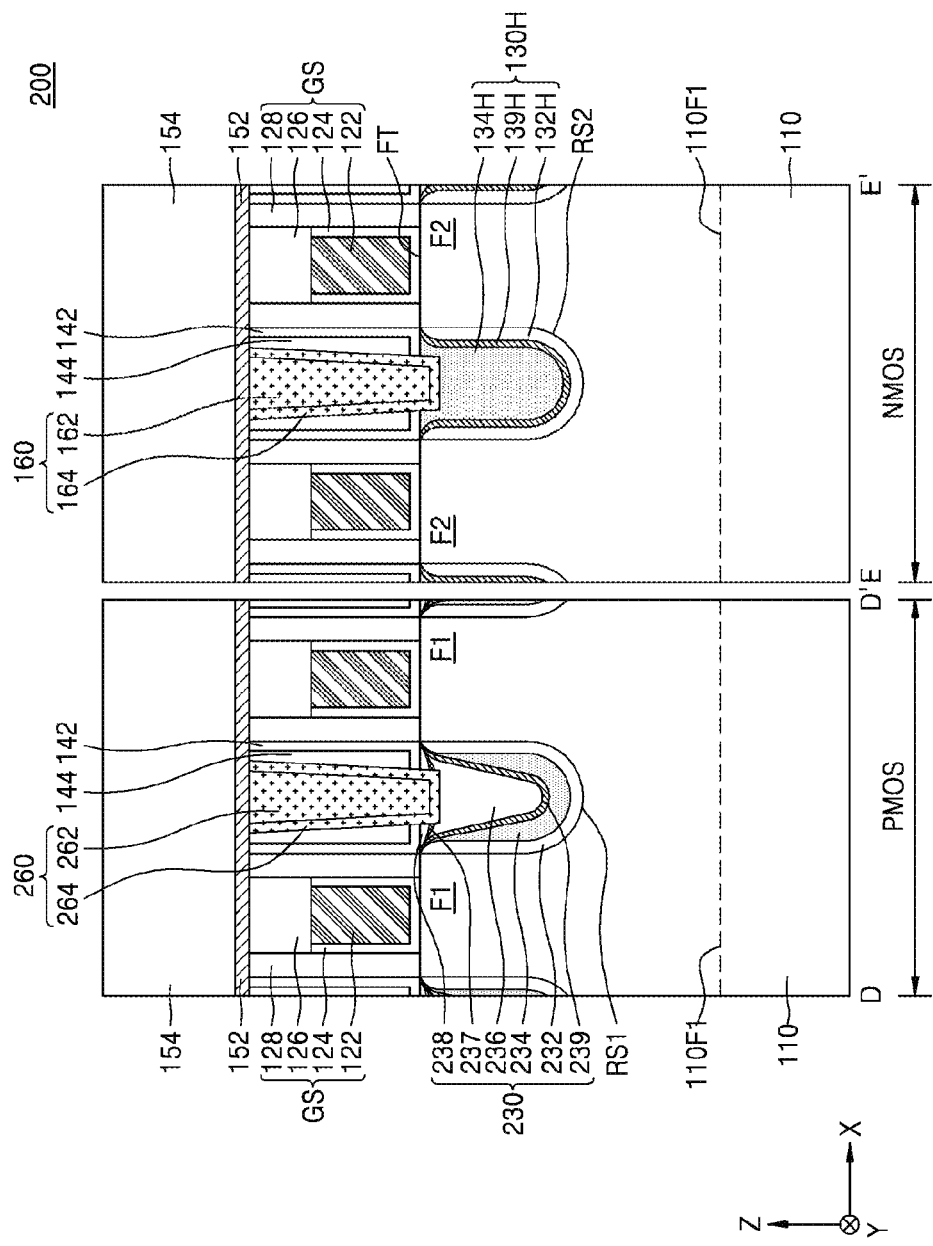
FIG. 16 is a cross-sectional view of the integrated circuit device taken along line D-D' and line E-E'.
Figure 17:
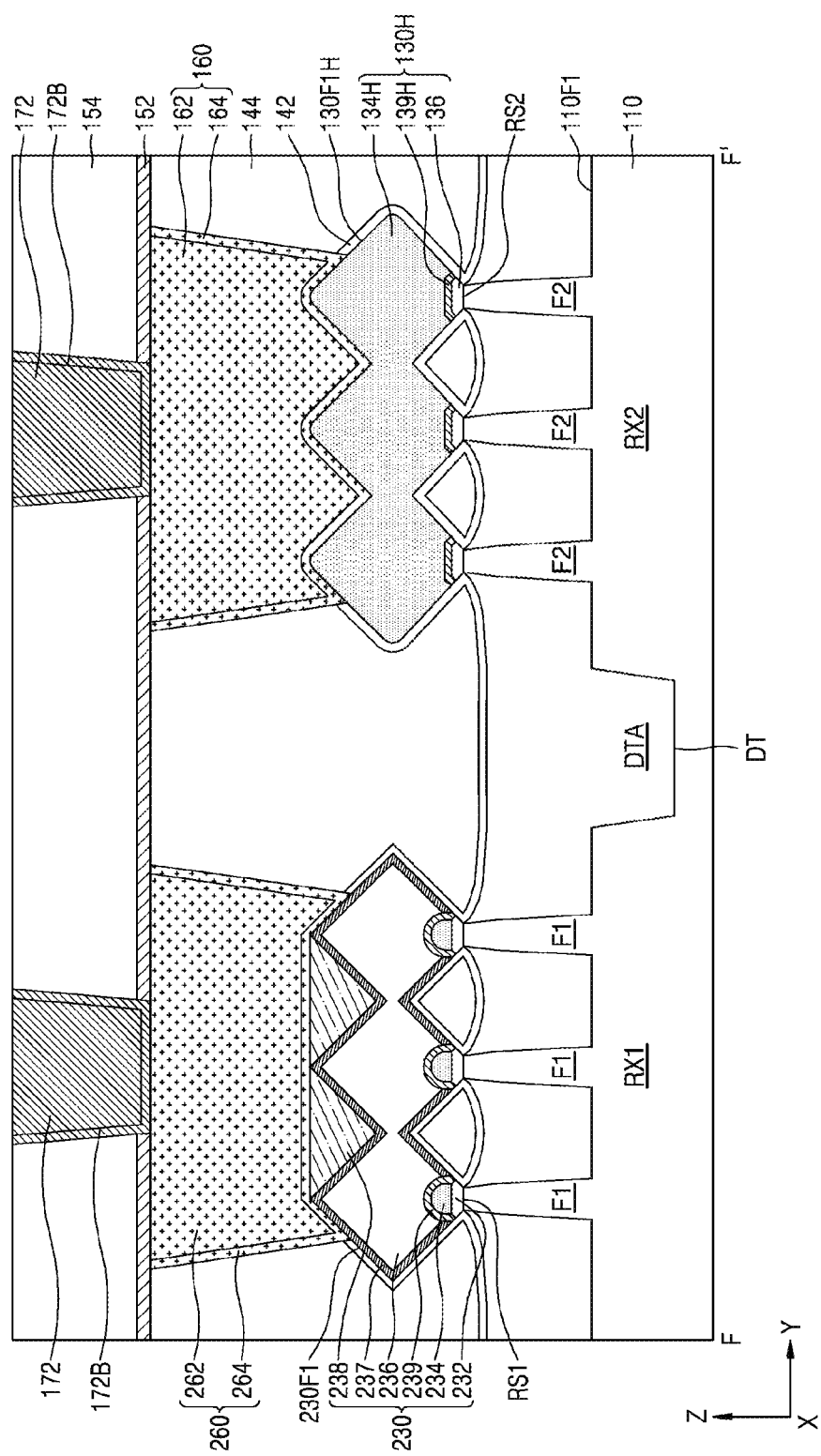
FIG. 17 is a cross-sectional view of the integrated circuit device taken along line F-F'.

FIG. 15 is a layout diagram illustrating an integrated circuit device 200 according to embodiments of the inventive concept. FIG. 16 is a cross-sectional view of the integrated circuit device 200 taken along line D-D' and line E-E', and FIG. 17 is a cross-sectional view of the integrated circuit device 200 taken along line F-F'. In FIGS. 15 through 17, like reference numerals as those of FIGS. 1 through 14 denote like elements.

Referring to FIGS. 15 through 17, the substrate 110 includes a first active region RX1, a second active region RX2, and a deep trench area DTA. The first active region RX1 and the second active region RX2 may be spaced apart from each other with the deep trench area DTA therebetween.

In example embodiments, the first active region RX1 may be an active region for a PMOS transistor, and the second active region RX2 may be an active region for an NMOS transistor. In other embodiments, the first active region RX1 may be an active region for an NMOS transistor having a first threshold voltage, and the second active region RX2 may be an active region for an NMOS transistor having a second threshold voltage that is different from the first threshold voltage.

In example embodiments, the first active region RX1, the second active region RX2, and the deep trench area DTA may constitute standard cells configured to perform a logic function. The standard cells may include various types of logic cells including, but not limited to, a plurality of circuit devices such as a transistor, a register, or the like. The logic cells may constitute, for example, logic gates, such as an AND, a NAND, an OR, a NOR, an XOR (exclusive OR), an XNOR (exclusive NOR), an INV (inverter), an ADD (adder), a BUF (buffer), a DLY (delay), a FIL (filter), a multiplexer (MXT/MXIT), an OAI (OR/AND/INVERTER), an AO (AND/OR), an AOI (AND/OR/INVERTER), a D flip-flop, a reset flip-flop, a master-slave flip-flop, a latch, or the like.

A plurality of first fin-type active regions F1 may be arranged to protrude from an upper surface 110F1 of the substrate 110 on the first active region RX1, and the plurality of first fin-type active regions F1 may extend in a first direction (X-direction). A plurality of second fin-type active regions F2 may be arranged to protrude from the upper surface 110F1 of the substrate 110 on the second active region RX2, and the plurality of first fin-type active regions F2 may extend in the first direction (X-direction). Two sidewalls of the plurality of first fin-type active regions F1 and two sidewalls of the plurality of second fin-type active regions F2 may be at least partially covered by the device isolation layer 112. A deep trench DT may be formed in the deep trench area DTA at a predetermined depth from the upper surface 110F1 of the substrate 110, and the deep trench DT may be at least partially filled with the device isolation layer 112.

The gate structure GS may extend in a second direction (Y-direction) to cross or intersect the plurality of first fin-type active regions F1 and the plurality of second fin-type active regions F2. Detailed description of the gate structure GS has been provided above with reference to FIGS. 1 through 4, and thus, further description thereof will be omitted here in the interest of brevity.

A first recess region RS1 extending into the first fin-type active region F1 on two sides of the gate structure GS on the first active region RX1 may be formed, and a first source/drain region 230 may be formed in the first recess region RS1. A second recess region RS2 extending into the second fin-type active region F2 on two sides of the gate structure GS on the second active region RX2 may be formed, and a second source/drain region 130H may be formed in the second recess region RS2.

The first source/drain region 230 may have a polygonal cross-section having a plurality of inclined sidewalls 230F1. As illustrated in FIG. 17, a sidewall portion of the first source/drain region 230 connected to one of the plurality of first fin-type active regions F1 and a sidewall portion of the first source/drain region 230 connected to another adjacent first fin-type active region F1 may be connected to each other, but embodiments of the inventive concept are not limited thereto. In some embodiments, the first source/drain region 230 may extend over two or three fin-type active regions FA that are adjacent to each other.

The first source/drain region 230 may include a first source/drain material layer 232, a second source/drain material layer 234, a third source/drain material layer 236, and a fourth source/drain material layer 238. A first dopant diffusion barrier layer 239 may be arranged between the second source/drain material layer 234 and the third source/drain material layer 236. In addition, a second dopant diffusion barrier layer 237 may be arranged between the third source/drain material layer 236 and the fourth source/drain material layer 238.

The second dopant diffusion barrier layer 237 may extend over two or three fin-type active regions FA that are adjacent to each other. However, the first dopant diffusion barrier layer 239 may not extend over two adjacent fin-type active regions.

A dopant diffusion barrier layer may be provided between two source/drain material layers that are adjacent to each other in a vertical direction as described above. Furthermore, the dopant diffusion barrier layer may also be provided on an interface between a lowermost source/drain material layer and a semiconductor substrate.

In a PMOS device, the dopant diffusion barrier layer may be doped at a relatively high concentration with one or more elements, such as carbon (C), boron (B), germanium (Ge), gallium (Ga), antimony (Sb), or the like. A concentration of these elements in the dopant diffusion barrier layer may be about 1E18 atoms/cm$^3$ to about 5E23 atoms/cm$^3$. In some embodiments, a concentration of the dopant diffusion-preventing elements may increase away from the substrate. For example, a concentration of elements of the dopant diffusion barrier layer may gradually increase from about 1E18 atoms/cm$^3$ to about 1E19 atoms/cm$^3$, from about 1E19 atoms/cm$^3$ to about 1E20 atoms/cm$^3$, from about 1E19 atoms/cm$^3$ to about 5E21 atoms/cm$^3$, from about 1E19 atoms/cm$^3$ to about 5E22 atoms/cm$^3$, or from about 1E19 atoms/cm$^3$ to about 5E23 atoms/cm$^3$, the farther away from the substrate. The increase may be monotonic in some embodiments of the inventive concept.

In an NMOS device, the dopant diffusion barrier layer may be doped with one or more elements, such as carbon (C), phosphorous (P), arsenic (As), or the like at a relatively high concentration. A concentration of these elements in the dopant diffusion barrier layer may be about 1E18 atoms/cm$^3$ to about 8E21 atoms/cm$^3$. In some embodiments, a concentration of the elements of the dopant diffusion barrier layer may increase away from the substrate. For example, a concentration of elements of the dopant diffusion barrier layer may gradually increase from about 1E18 atoms/cm$^3$ to about 1E20 atoms/cm$^3$, from about 1E19 atoms/cm$^3$ to about 1E21 atoms/cm$^3$, from about 1E19 atoms/cm$^3$ to about 5E21 atoms/cm$^3$, or from about 1E19 atoms/cm$^3$ to about 8E21 atoms/cm$^3$, the farther away from the substrate. The increase may be monotonic in some embodiments of the inventive concept.

In some embodiments, the first through fourth source/drain material layers 232, 234, 236, and 238 may include SiGe, and a source/drain material layer at a relatively upper position may have a higher Ge concentration than a source/drain material layer at a relatively lower position with respect to the substrate 110.

The second source/drain region 130H may have a polygonal cross-section having a plurality of inclined sidewalls 130F1H. As illustrated in FIG. 17, a sidewall portion of the second source/drain region 130H connected to one of the plurality of second fin-type active regions F2 and a sidewall portion of the second source/drain region 130H connected to another adjacent second fin-type active region F2 may be connected to each other, but embodiments of the inventive concept are not limited thereto.

The second source/drain region 130H may include a fifth source/drain material layer 132H and a sixth source/drain material layer 134H. A third dopant diffusion barrier layer 139H may be provided between the fifth source/drain material layer 132H and the sixth source/drain material layer 134H. In some embodiments, the fifth and sixth source/drain material layers 132H and 134H may include SiP, and a source/drain material layer at a relatively upper position may have a higher P concentration than a source/drain material layer at a relatively lower position with respect to the substrate 110.

In the present detailed description, the terms such as "first" and "second" or the like with respect to the first through sixth source/drain material layers 232, 234, 236, 238, 132, and 134 are used to distinguish one element from other elements only. For example, without departing from the scope of the inventive concept, a first source/drain material layer may be referred to as a second source/drain material layer, and on the contrary, a second source/drain material layer may be referred to as a first source/drain material layer.

In example embodiments, the integrated circuit device 200 may include the source/drain regions described with reference to FIGS. 1 through 5B and a combination thereof, instead of the first source/drain region 230 and/or the second source/drain region 130H.

A first contact structure 260 may be arranged to pass through the first etch stop layer 142 and the intergate insulating layer 144 to contact the first source/drain region 230. The first contact structure 260 may include a first contact plug 262 and a first conductive barrier 264 on and/or at least partially surrounding a sidewall and a bottom surface of the first contact plug 262. Selectively, a silicide layer (not shown) may be formed between the first conductive barrier 264 and the first source/drain region 230.

In example embodiments, the first contact plug 262 may include at least one of tungsten (W), cobalt (Co), nickel (Ni), ruthenium (Ru), copper (Cu), aluminum (Al), a silicide thereof, and an alloy thereof. In example embodiments, the first conductive barrier 264 may include at least one of a titanium nitride, titanium, a tantalum nitride, tantalum, ruthenium, and/or a ruthenium nitride.

A second contact structure 160 may be arranged to pass through the first etch stop layer 142 and the intergate insulating layer 144 to contact the second source/drain region 130H. The second contact structure 160 may include a second contact plug 162 and a second conductive barrier 164 on and/or at least partially surrounding a side surface and a bottom surface of the second contact plug 162. Selectively, a silicide layer (not shown) may be formed between the second conductive barrier 164 and the second source/drain region 130H.

Upper surfaces of the first contact structure 260 and the second contact structure 160 may be at least partially covered by the second etch stop layer 152, but embodiments of the inventive concept are not limited thereto. A via contact 172 may be arranged between the first contact structure 260 and the second contact structure 160. The via contact 172 may pass through the first interlayer insulating layer 154 and the second etch stop layer 152 to be arranged on the upper surface of the first contact structure 260 and the upper surface of the second contact structure 160. As illustrated in FIG. 17, a conductive barrier 172B may be arranged to be on and/or at least partially surround a side surface and a bottom surface of the via contact 172.

The gate contact 174 may be arranged on the gate structure GS. For example, the gate contact 174 may be arranged to pass through the first interlayer insulating layer 154, the second etch stop layer 152, and the gate capping layer 128 to contact the gate electrode 122. As illustrated in FIG. 15 as an example, the gate contact 174 may be arranged to contact the gate structure GS on the deep trench area DTA, but embodiments of the inventive concept are not limited thereto, and the gate contact 174 may also be arranged to contact the gate structure GS on the first active region RX1 or the second active region RX2.

Figure 18:
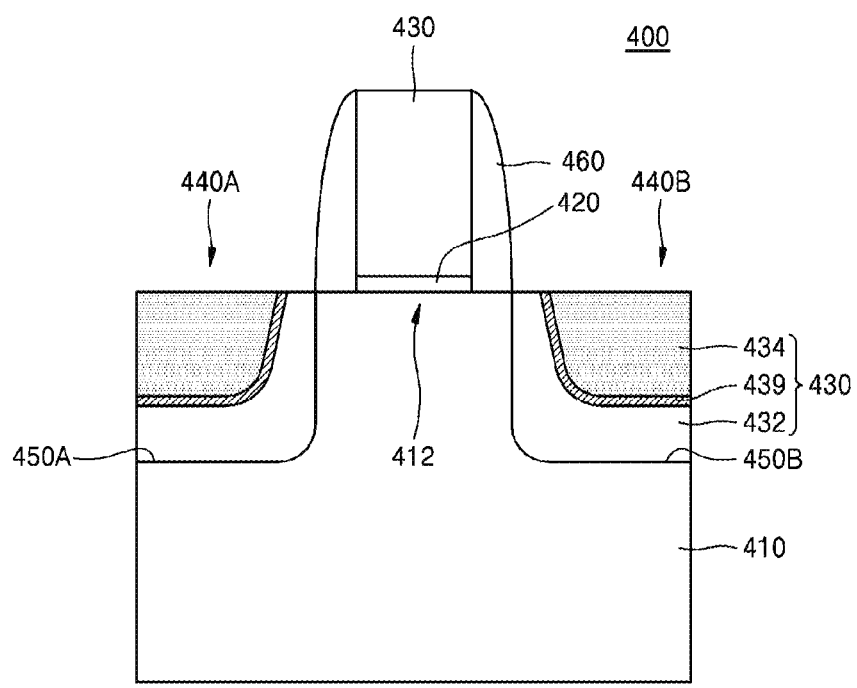
FIG. 18 is a side cross-sectional view of a semiconductor device according to another embodiment of the inventive concept.

FIG. 18 is a side cross-sectional view of a semiconductor device 400 according to further embodiments of the inventive concept.

Referring to FIG. 18, spacers 460 are formed on two opposing sidewalls of a gate structure 430 and a gate insulating layer 420 provided on a channel region 412 of a substrate 410. The spacers 460 may include a single layer or have a multi-layer structure in which multiple layers are stacked in accordance with various embodiments of the inventive concept.

A recess 450A at a source region 440A may have substantially a same depth as a recess 450B at a drain region 440B. A first source/drain material layer 432 and a second source/drain material layer 434 may be provided in the recesses 450A and 450B. In addition, a first dopant diffusion barrier layer 439 may be provided between the first source/drain material layer 432 and the second source/drain material layer 434.

The first source/drain material layer 432, the second source/drain material layer 434, and the first dopant diffusion barrier layer 439 may be substantially the same as the first source/drain material layer 132, the second source/drain material layer 134, and the first dopant diffusion barrier layer 139 described with reference to FIGS. 1 through 4 above in terms of materials, forming methods, functions, or the like. Thus, repeated description will be omitted here in the interest of brevity.

Figure 19A:
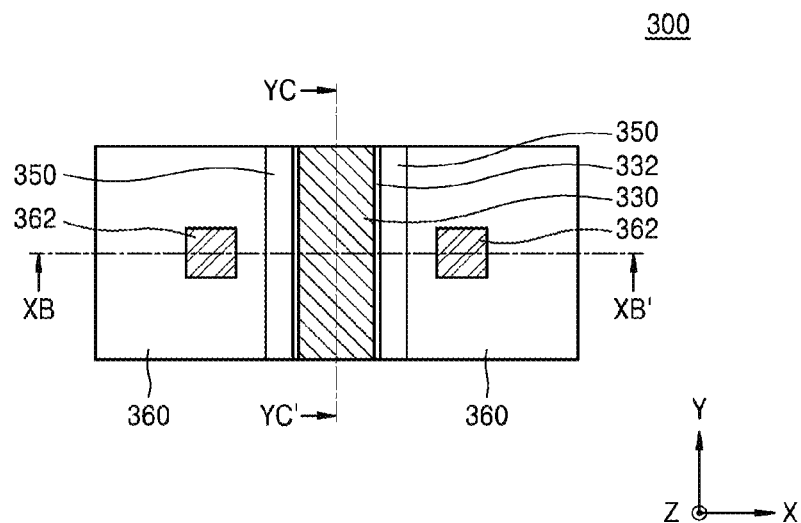
FIGS. 19A through 19C illustrate parts of an integrated circuit device according to further example embodiments of the inventive concept.
Figure 19B:
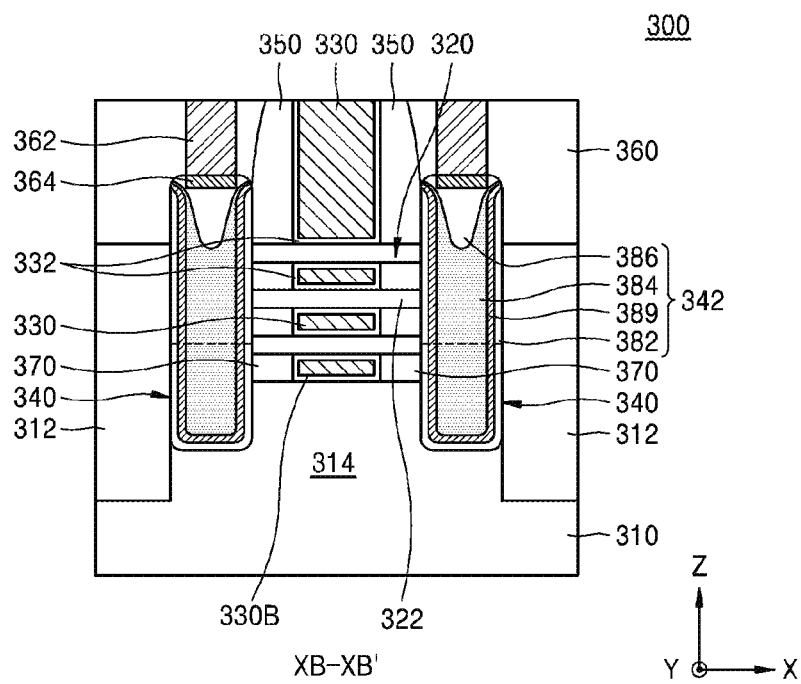
Figure 19C:
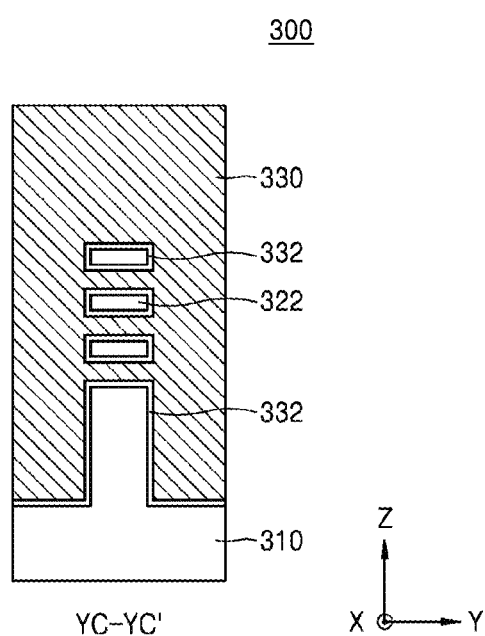

FIGS. 19A through 19C illustrate parts of a semiconductor device 300 according to further embodiments of the inventive concept. In more detail, FIG. 19A is a plan view of the semiconductor device 300. FIG. 19B is a cross-sectional view of the semiconductor device 300 taken along XB-XB' of FIG. 19A. FIG. 19C is a cross-sectional view of the semiconductor device 300 taken along YC-YC' of FIG. 19A.

Referring to FIGS. 19A through 19C, the semiconductor device 300 may include a substrate 310, a nanosheet 320 spaced apart from the substrate 310 and extending in a direction (X-direction) that is parallel to an extension direction of a main surface of the substrate 310, and a gate 330 at least partially surrounding at least a portion of the nanosheet 320.

In some embodiments, the substrate 310 may include a silicon substrate. In some embodiments, the substrate 310 may constitute any one device selected from a system large scale integration (LSI), a logic circuit, and an image sensor such as a complementary metal oxide (CMOS) imaging sensor (CIS), a memory device such as a flash memory, dynamic random access memory (DRAM), static RAM (SRAM), electrically erasable programmable read-only memory (EEPROM), phase-change RAM (PRAM), magnetic random access memory (MRAM), or resistive RAM (RRAM), or a micro-electro-mechanical system (MEMS).

An active region 314 is defined in the substrate 310 by a device isolation layer 312. A plurality of wells may be formed in the active region 314 of the substrate 310.

The nanosheet 320 includes a channel region 322. The gate 330 is on and/or at least partially surrounds at least a portion of the channel region 322.

The nanosheet 320 may include a Group IV semiconductor, a Group IV-IV compound semiconductor, or a Group III-V compound semiconductor. In some embodiments, the nanosheet 320 may include Si, Ge, or SiGe. In some other embodiments, the nanosheet 320 may include InGaAs, InAs, GaSb, InSb or a combination thereof.

A gate insulating layer 332 is interposed between the channel region 322 and the gate 330.

In some embodiments, the gate insulating layer 332 may include a silicon oxide layer, a silicon oxynitride layer, a high-k dielectric layer having a higher dielectric constant than a silicon oxide layer, or a combination thereof. For example, examples of a high-k dielectric layer that may be used in the gate insulating layer 332 may include $HfO_2$, HfSiO, HfSiON, HfTaO, HfTiO, HfZrO, a zirconium oxide, an aluminum oxide, a $HfO_2$-$Al_2O_3$ alloy, or a combination thereof, but embodiments of the inventive concept are not limited thereto.

In some embodiments, the gate 330 may include doped polysilicon, a metal or a combination thereof. For example, the gate 330 may be formed of Al, Cu, Ti, Ta, W, Mo, TaN, NiSi, CoSi, TiN, WN, TiAl, TiAlN, TaCN, TaC, TaSiN, or a combination thereof, but embodiments of the inventive concept are not limited thereto.

A pair of semiconductor layers 340 extending in a direction (Z-direction) perpendicular to a main surface of the substrate 310 up to two end portions of the nanosheet 320 are formed on the substrate 310. In some embodiments, the semiconductor layer 340 may include one or more of a SiGe layer, a Ge layer, a SiC layer, or an InGaAs layer, but embodiments of the inventive concept are not limited thereto.

The semiconductor layer 340 may include a semiconductor layer regrown from the substrate 310 and the nanosheet 320 by using an epitaxy process. In some embodiments, the semiconductor layer 340 may include a different material from that of the substrate 310 and the nanosheet 320.

The semiconductor layers 340 of the pair each include an impurity region 342. The impurity region 342 may be formed by implanting the semiconductor layer 340 with an N-type impurity ion or a P-type impurity ion. The impurity region 342 may be formed up to a depth marked by a dotted line shown in FIG. 19B. For example, the impurity region 342 may include a doped SiGe layer, a doped Ge layer, a doped SiC layer, or a doped InGaAs layer, but embodiments of the inventive concept are not limited thereto.

In some embodiments, the depth marked by the dotted line may be a level higher than a bottom surface 330B that is most adjacent to the substrate 310 from among the gate 330 layers as illustrated in FIG. 19B. However, embodiments of the inventive concept are not limited thereto.

The pair of impurity regions 342 formed in the pair of semiconductor layers 340 abut on two end portions of the nanosheet 320, and may extend to a higher level than the nanosheet 320 relative to the substrate 310 in a direction (Z-direction) perpendicular to a main surface of the substrate 310.

The pair of impurity regions 342 may include a first source/drain material layer 382, a second source/drain material layer 384, and a third source/drain material layer 386. In addition, the pair of impurity regions 342 may further include a first dopant diffusion barrier layer 389 between the first source/drain material layer 382 and the second source/drain material layer 384.

The first source/drain material layer 382, the second source/drain material layer 384, the third source/drain material layer 386, and the first dopant diffusion barrier layer 389 are substantially the same as the first source/drain material layer 182, the second source/drain material layer 184, the third source/drain material layer 186, and the first dopant diffusion barrier layer 189 described with reference to FIGS. 5A through 5B, and thus, repeated description will be omitted here in the interest of brevity.

Two end portions of the nanosheet 320 adjacent to the impurity region 342 are at least partially covered by an external insulating spacer 350 covering sidewalls of the gate 330.

A portion of the impurity region 342 and a portion of the external insulating spacer 350 are at least partially covered by an interlayer insulating layer 360. The impurity region 342 is connected to a contact 362 that passes through the interlayer insulating layer 360. A metal silicide layer 364 may be formed between the impurity region 342 and the contact 362. As the metal silicide layer 364 is formed on a surface of the impurity region 342, resistance of the impurity region 342 and resistance of the contact 362 may be reduced. In some embodiments, the metal silicide layer 364 may include a cobalt silicide layer, but embodiments of the inventive concept are not limited thereto. In some embodiments, the metal silicide layer 364 may be omitted.

A pair of internal insulating spacers 370 is formed between the substrate 310 and the nanosheet 320. The pair of internal insulating spacers 370 is interposed between the gate 330 and the impurity region 342. The internal insulating spacers 370 may be formed of a different material from that of the gate insulating layer 332.

The gate insulating layer 332 extends from a surface of the channel region 322 of the nanosheet 320 up to a sidewall surface of the internal insulating spacers 370 to be interposed between the gate 330 and the internal insulating spacers 370, between the substrate 310 and the nanosheet 320.

In some embodiments, the internal insulating spacers 370 may include a different material from that of the gate insulating layer 332. In some embodiments, the internal insulating spacers 370 may include a material having a lower dielectric constant than that of a material of the gate insulating layer 332. In some embodiments, the internal insulating spacers 370 may include an oxide of a Group IV semiconductor, an oxide of a Group IV-IV compound semiconductor, an oxide of a Group III-V compound semiconductor, a silicon oxide, or a combination thereof. For example, the internal insulating spacers 370 may include an oxide of SiGe, an oxide of InP, or a silicon oxide, but embodiments of the inventive concept are not limited thereto.

The external insulating spacer 350 and the internal insulating spacers 370 are formed at locations where they overlap each other at different levels on the substrate 310 in a direction (Z-direction) perpendicular to an extension direction of a main surface of the substrate 310. In some embodiments, the internal insulating spacers 370 may include a different material from that of the external insulating spacer 350. In some embodiments, the internal insulating spacers 370 may include a material having a lower dielectric constant than that of a material of the external insulating spacer 350.

The semiconductor device 300 may be configured as a transistor. In some embodiments, when an N-type well is formed in an active region 314 of the substrate 310, and the source/drain region 340 is doped with a P-type impurity, the semiconductor device 300 may constitute a PMOS transistor. In some other embodiments, when a P-type well is formed in the active region 314 of the substrate 310, and the source/drain region 340 is doped with an N-type impurity, the semiconductor device 300 may constitute an NMOS transistor.

A carrier mobility of a MOS transistor may have a great impact on power consumption and switching performance of a device. A higher switching rate may be obtained and operation may be conducted at a low voltage by increasing a carrier mobility, thereby reducing power consumption. In some embodiments, to increase carrier mobility of the semiconductor device 300 constituting a MOS transistor, a channel region 322 of the nanosheet 320 may have a strained channel.

In an embodiment, when the semiconductor device 300 is configured as a PMOS transistor, to provide the nanosheet 320 having a strained channel, the nanosheet 320 may include Si, and a pair of impurity regions 342 connected to two ends of the nanosheet 320 may include doped SiGe or doped Ge. In another example, when the semiconductor device 300 constitutes a PMOS transistor, to provide a nanosheet 320 having a strained channel, the nanosheet 320 may include Ge, and the pair of impurity regions 342 may include SiGe. In another example, when the semiconductor device 300A constitutes an NMOS transistor, to provide the nanosheet 320 having a strained channel, the nanosheet 320 may include Si, and the pair of impurity regions 342 may include SiP.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a semiconductor substrate;
   a device isolation layer defining an active region of the semiconductor substrate;
   at least one nanosheet at a position apart from a top surface of the active region to face the top surface of the active region, the at least one nanosheet having a channel region;
   a gate arranged under and above the at least one nanosheet;
   a gate insulating layer between the at least one nanosheet and the gate; and
   a source/drain region arranged on the active region on opposite sides of the at least one nanosheet,
   wherein the source/drain region comprises:
   a first source/drain material layer;
   a second source/drain material layer on the first source/drain material layer; and
   a first dopant diffusion barrier layer including a dopant diffusion-preventing element on an interface between the first source/drain material layer and the second source/drain material layer,
   wherein a concentration of the dopant diffusion-preventing element in the first dopant diffusion barrier layer is at least twice a concentration of a same dopant in the first source/drain material layer.

2. The semiconductor device of claim 1, further comprising a pair of internal insulating spacers between the semiconductor substrate and the nanosheet and between the gate and the source/drain region.

3. The semiconductor device of claim 2, wherein the gate insulating layer extends from a surface of the channel region of the nanosheet to a sidewall surface of the internal insulating spacers to be interposed between the gate and the internal insulating spacer.

4. The semiconductor device of claim 3, wherein the internal insulating spacers comprise a material having a lower dielectric constant than that of a material of the gate insulating layer.

5. The semiconductor device of claim 4, wherein the dopant diffusion-preventing element comprises carbon (C), boron (B), germanium (Ge), indium (In), gallium (Ga), antimony (Sb), phosphorous (P), or arsenic (As).

6. The semiconductor device of claim 5, wherein the semiconductor device is a PMOS device, and
wherein the first source/drain material layer and the second source/drain material layer comprise SiGe.

7. The semiconductor device of claim 6, wherein a germanium (Ge) concentration of the first source/drain material layer is higher than a Ge concentration of the second source/drain material layer.

8. The semiconductor device of claim 6, further comprising:
a third source/drain material layer on the second source/drain material layer.

9. The semiconductor device of claim 5, wherein the semiconductor device is an NMOS device, and
the first source/drain material layer and the second source/drain material layer comprise SiP.

10. The semiconductor device of claim 9, wherein a phosphorous (P) concentration of the first source/drain material layer is higher than a P concentration of the second source/drain material layer.

11. The semiconductor device of claim 1, wherein the dopant diffusion-preventing element is clustered at points on the interface between the first source/drain material layer and the second source/drain material layer in an atom probe tomography (APT) analysis of the first dopant diffusion barrier layer.

12. The semiconductor device of claim 11, wherein the points at which the dopant diffusion-preventing element are clustered are distributed in the first dopant diffusion barrier layer in a non-contiguous manner.

13. A semiconductor device comprising:
a semiconductor substrate;
a device isolation layer defining an active region of the semiconductor substrate;
at least one nanosheet at a position apart from a top surface of the active region to face the top surface of the active region, the at least one nanosheet having a channel region;
a gate arranged under and above the at least one nanosheet;
a gate insulating layer between the at least one nanosheet and the gate; and
a source/drain region arranged on the active region on opposite sides of the at least one nanosheet,
wherein the source/drain region comprises:
a first source/drain material layer;
a second source/drain material layer on the first source/drain material layer; and
a first dopant diffusion barrier layer including a dopant diffusion-preventing element on an interface between the first source/drain material layer and the second source/drain material layer, and
wherein points at which the dopant diffusion-preventing element are clustered are distributed in the first dopant diffusion barrier layer in a non-contiguous manner.

14. The semiconductor device of claim 13, wherein the dopant diffusion-preventing element comprises carbon (C), boron (B), germanium (Ge), indium (In), gallium (Ga), antimony (Sb), phosphorous (P), or arsenic (As).

15. The semiconductor device of claim 14, wherein the semiconductor device is a PMOS device, and
wherein the first source/drain material layer and the second source/drain material layer comprise SiGe.

16. The semiconductor device of claim 14, wherein a Ge concentration of the first source/drain material layer is substantially equal to a Ge concentration of the second source/drain material layer.

17. The semiconductor device of claim 14, wherein a concentration of a dopant diffusion-preventing element of the dopant diffusion barrier layer is about 1E18 atoms/cm$^3$ to about 5E23 atoms/cm$^3$.

18. The semiconductor device of claim 14, wherein the semiconductor device is an NMOS device, and
the first source/drain material layer and the second source/drain material layer comprise SiP.

19. The semiconductor device of claim 18, wherein a concentration of a dopant diffusion-preventing element of the dopant diffusion barrier layer is about 1E18 atoms/cm$^3$ to about 8E21 atoms/cm$^3$.

20. A semiconductor device comprising:
a semiconductor substrate comprising a first device region and a second device region;
a device isolation layer defining an active region of the semiconductor substrate;
at least one nanosheet at a position apart from a top surface of the active region to face the top surface of the active region, the at least one nanosheet having a channel region;
a gate surrounding at least a portion of the at least one nanosheet;
a gate insulating layer between the at least one nanosheet and the gate;
a first conductivity type impurity region arranged on the active region on opposite sides of the at least one nanosheet in the first device region; and
a second conductivity type impurity region arranged on the active region on opposite sides of the at least one nanosheet in the second device region,
wherein at least one of the first conductivity type impurity region and the second conductivity type impurity region comprises:
a first source/drain material layer;
a second source/drain material layer on the first source/drain material layer; and
a first dopant diffusion barrier layer on an interface between the first source/drain material layer and the second source/drain material layer,
wherein a concentration of a dopant diffusion-preventing element in the first dopant diffusion barrier layer is at least twice a concentration of a same dopant in the first source/drain material layer.

* * * * *